(12) United States Patent
Bardfield et al.

(10) Patent No.: US 11,257,969 B2
(45) Date of Patent: Feb. 22, 2022

(54) BLOCKING DIODE BOARD FOR ROLLABLE SOLAR POWER MODULE

(71) Applicant: The Boeing Company, Chicago, IL (US)

(72) Inventors: Rina S. Bardfield, Sherman Oaks, CA (US); Thomas P. Crocker, Newhall, CA (US); Dale H. Waterman, Rancho Cucamonga, CA (US); William G. Wise, Tarzana, CA (US)

(73) Assignee: THE BOEING COMPANY, Chicago, IL (US)

( * ) Notice: Subject to any disclaimer, the term of this patent is extended or adjusted under 35 U.S.C. 154(b) by 165 days.

(21) Appl. No.: 15/922,903

(22) Filed: Mar. 15, 2018

(65) Prior Publication Data

US 2019/0319146 A1  Oct. 17, 2019

(51) Int. Cl.
| | |
|---|---|
| *H01L 31/0443* | (2014.01) |
| *H01L 31/052* | (2014.01) |
| *H01L 31/05* | (2014.01) |
| *H01L 31/0392* | (2006.01) |

(52) U.S. Cl.
CPC .... *H01L 31/0443* (2014.12); *H01L 31/03926* (2013.01); *H01L 31/0504* (2013.01); *H01L 31/0521* (2013.01)

(58) Field of Classification Search
None
See application file for complete search history.

(56) References Cited

U.S. PATENT DOCUMENTS

| | | | |
|---|---|---|---|
| 4,537,838 A * | 8/1985 | Jetter | H01L 31/02008 136/244 |
| 4,860,509 A | 8/1989 | Laaly et al. | |
| 6,660,930 B1 | 12/2003 | Gonsiorawski | |
| 9,653,632 B1 | 5/2017 | Beitman | |
| 2004/0016454 A1 | 1/2004 | Murphy et al. | |
| 2013/0019919 A1 | 1/2013 | Hoang et al. | |
| 2014/0213013 A1 | 7/2014 | Britt et al. | |
| 2014/0230880 A1 | 8/2014 | Sakuma et al. | |
| 2015/0144173 A1 | 5/2015 | Hoang et al. | |
| 2015/0171788 A1* | 6/2015 | Bunea | H02S 40/34 136/244 |

(Continued)

FOREIGN PATENT DOCUMENTS

| | | |
|---|---|---|
| CN | 202064255 U | 12/2011 |
| CN | 104078522 A | 10/2014 |

(Continued)

OTHER PUBLICATIONS

Campbell D. et al.—"Development of a Novel, Passively Deployed Roll-Out Solar Array" http://ieeexplore.ieee.org/stamp/stamp.jsp?arnumber=1655994 2006, 9 pgs.

(Continued)

*Primary Examiner* — Shannon M Gardner
(74) *Attorney, Agent, or Firm* — Moore Intellectual Property Law, PLLC

(57) ABSTRACT

A blocking diode board ("BDB") for use with a rollable solar power module ("RSPM") array is disclosed. The DBD includes a blocking diode, first flat electrical conductor, second flat electrical conductor, first tubular hook, and second tubular hook.

20 Claims, 25 Drawing Sheets

(56) References Cited

U.S. PATENT DOCUMENTS

| | | |
|---|---|---|
| 2015/0380588 A1 | 12/2015 | Lasich |
| 2017/0012154 A1 | 1/2017 | Aiken et al. |
| 2017/0297749 A1 | 10/2017 | Steele et al. |
| 2018/0158970 A1 | 6/2018 | Yoon et al. |
| 2019/0288137 A1 | 9/2019 | Waterman et al. |
| 2019/0288638 A1 | 9/2019 | Crocker et al. |
| 2019/0319146 A1 | 10/2019 | Bardfield et al. |

FOREIGN PATENT DOCUMENTS

| | | |
|---|---|---|
| DE | 2160345 C2 | 12/1973 |
| DE | 10136442 A1 | 2/2003 |
| DE | 202011001341 U1 | 4/2012 |
| EP | 3457562 A4 | 5/2019 |
| GB | 2114815 B | 4/1986 |
| WO | 2011011091 A3 | 7/2011 |
| WO | 2017195289 A1 | 11/2017 |

OTHER PUBLICATIONS

Microsemi 1N54181 Datasheet, T4-LDS-0231, Rev. 1 (111902) © 2011 Microsemi Corporation, 5 pgs.

\* cited by examiner

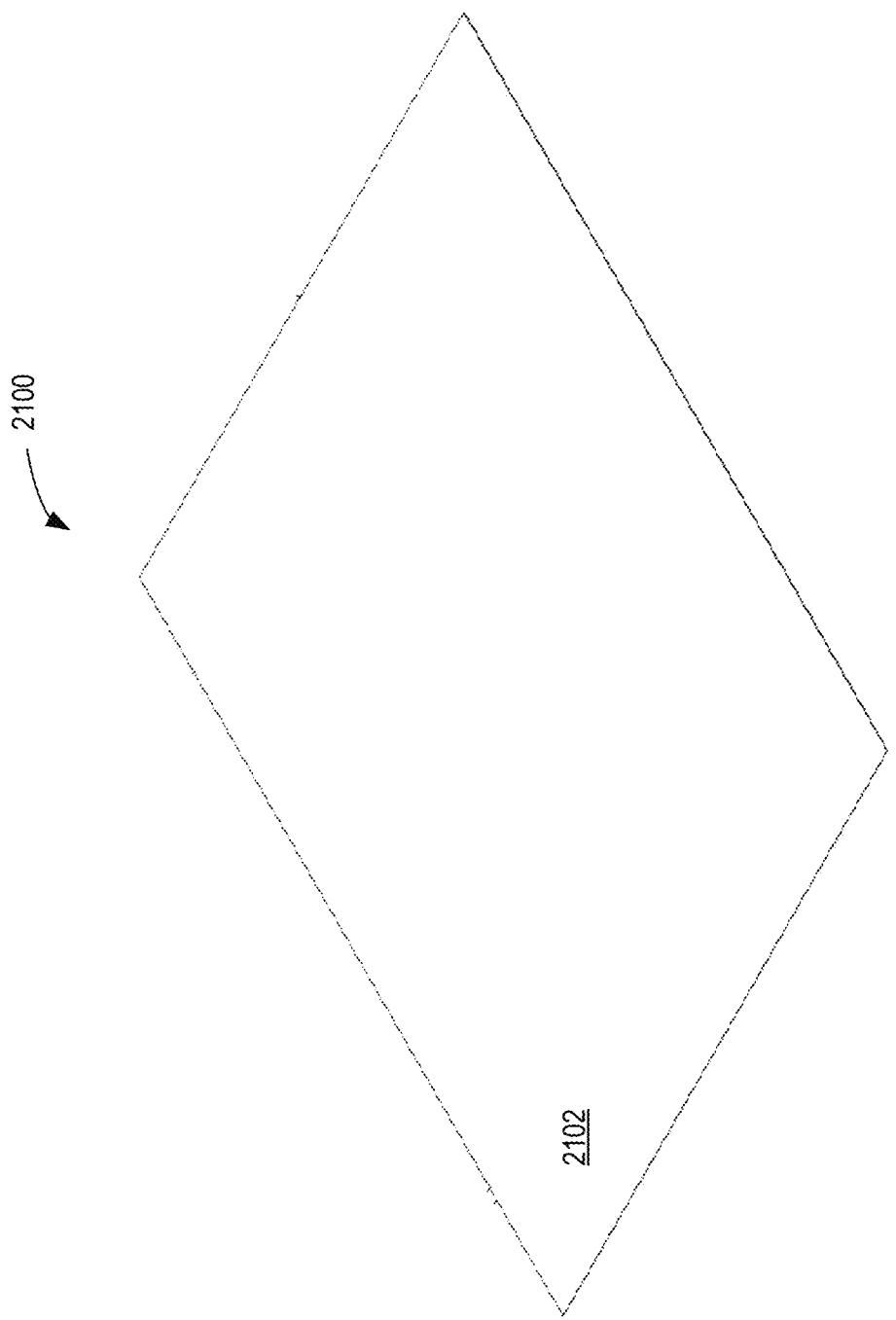

BLOCKING DIODE BOARD FOR ROLLABLE SOLAR POWER MODULE

BACKGROUND

1. Field

This invention relates to solar panels assemblies and, in particular, to solar panels assemblies that are deployable from a spacecraft.

2. Related Art

Advances in photovoltaic ("PV") solar cell technology have resulted in the development of lightweight, highly efficient, and highly reliable solar panels. As such, solar panels are commonly used as the primary power source on spacecraft such as satellites; however, they are delicate, large, and must be unfolded when the satellite arrives in either low-earth orbit ("LEO") or geostationary orbit ("GEO"). Generally, these solar panels are initially stowed into a small volume for shipment and launch, and are deployed when in space to expose a large surface area of the PV solar cells to the Sun in order to collect solar radiation and convert the collected solar radiation into electrical power necessary to operate the satellite.

However, power systems for space applications face numerous design constraints including criteria to minimize weight, minimize stowed volume, maximize beginning or life to end of life performance, and minimize cost. Weight and volume constraints are usually the result of space boaster technology that limits the size and weight of an object that may be lifted into orbit.

Moreover, known approaches to utilize solar panel assemblies in space applications have included utilizing a solar panel assembly structure that typically includes flat rigid honeycomb solar panel substrates having mounted PV solar cells. The solar panel assembly is configured so as to allow the solar panel assembly to be stowed in the satellite utilizing hinges (or other similar mechanical devices) that permit the solar panel assembly to be folded so as to minimize the dimensions of the solar panel assembly when in the stowed configuration. This solar panel assembly typically includes one or more solar panels electrically and mechanically attached to each other and to the satellite. Each solar panel in the solar panel assembly typically includes numerous individual PV solar cells, which are usually laid out in rows and connected together electrically at their adjacent edges to form a two-dimensional array of PV solar cells. In general, the size and weight of these large stiff solar panel assemblies and their associated mechanical components for solar panel deployment on the satellite (when in orbit) are high and are desirable to minimize.

Approaches to help minimize the size and weight of the solar panel assemblies have included utilizing light weight flexible substrates or blankets instead of the large and heavy rigid honeycomb panels. Some of these approaches have been utilized on the Hubble Space Telescope and for the primary solar panels assemblies of the International Space Station ("ISS").

In the case of the Hubble Space Telescope, the solar panels were packaged in a roll and deployed with booms mounted on either side of the roll that pull the roll out into a sheet as they extend. The ISS solar panels were packaged into a stack by folding and pleating a long, thin sheet of material that is deployed with a single boom mounted underneath the array that pulls the stack into a sheet as it extends.

At present, a proposed new type of solar panel assembly is being developed for the ISS. This approach is known as the Roll-Out Solar Array ("ROSA") and is a new type of solar panel that will roll open in space like a party favor and is more compact than current rigid panel designs. According to United States National Air and Space Administration ("NASA"), the proposed ROSA design will significantly improve the power density and stowage efficiency and scalability over current rigid panel array technology and appears to have a high promise for consideration on all future NASA, Department of Defense ("DoD") and commercial spacecraft.

However, producing a high power density solar panel assembly that has a high density concentration of PV solar cells and is flexible enough to roll into a stowed position is very difficult because the PV solar cells are generally rigid and susceptible to physical breakage when flexed, the wired or welded tabs utilized as interconnects between the PV solar cells are typically devices that extend outward from the plane of the surface of the flexible substrates or blankets utilized for the solar panel assemblies. These interconnects may be metal wires or tabs that need to bend properly when the solar panel assembly is rolled into a stowed state that has a cylindrical shape without shorting any electrical connections on the solar panel assembly or without physically breaking any of the interconnects or PV solar cells. As such, there is a need for a system and method that address these limitations.

SUMMARY

A blocking diode board ("BDB") for use with a rollable solar power module ("RSPM") array is disclosed. The DBD includes a blocking diode, first flat electrical conductor, second flat electrical conductor, first tubular hook, and second tubular hook. The blocking diode includes a first radial extension that is a first wire and a second radial extension that is a second wire. The first tubular hook monolithically extends from the first flat electrical conductor, where the first tubular hook is physically and electrically connected to the first radial extension. Similarly, the second tubular hook monolithically extends from the second flat electrical conductor, where the second tubular hook is physically and electrically connected to the second radial extension. The first tubular hook and second tubular hook are located within a first plane and the blocking diode is located in a second plane and the first radial extension includes a first bend from the first plane to the second plane and the second radial extension includes a second bend from the first plane to the second plane.

A RSPM configured to be rollable is also disclosed. The RSPM includes a flexible substrate, a plurality of adjacent strings of photovoltaic ("PV") solar cells, and at least one end-tab jumper. The flexible substrate has a flexible substrate length and a top surface that defines a first plane. The plurality of adjacent strings of PV solar cells are attached on the top surface of the flexible substrate. Each PV solar cell has a perimeter that is a convex polygon. The plurality of adjacent strings are configured to be rollable along the flexible substrate length, where each adjacent string of the plurality of adjacent strings has an orientation along the flexible substrate length and each two adjacent strings of a pair of adjacent strings have orientations in opposite directions. The at least one end-tab jumper is physically and electrically connected to the plurality of adjacent strings, where the at least one end-tab jumper electrically connects the plurality of adjacent strings to form a series circuit.

Also disclosed is a method for fabricating the RSPM. The method includes attaching a plurality PV solar cells together to form a plurality of adjacent strings, attaching a plurality of end-tabs to each of the adjacent strings, and attaching at least one end-tab jumper to the plurality of end-tabs. The method also includes attaching two pickup-tabs to create a PV solar panel assembly and attaching the PV solar panel assembly to a flexible substrate.

Other devices, apparatus, systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

FIG. 21 is a perspective view of an example of an implementation of a flexible substrate in accordance with the present disclosure.

DETAILED DESCRIPTION

A blocking diode board ("BDB") for use with a rollable solar power module ("RSPM") array is disclosed. The DBD includes a blocking diode, first flat electrical conductor, second flat electrical conductor, first tubular hook, and second tubular hook. The blocking diode includes a first radial extension that is a first wire and a second radial extension that is a second wire. The first tubular hook monolithically extends from the first flat electrical conductor, where the first tubular hook is physically and electrically connected to the first radial extension. Similarly, the second tubular hook monolithically extends from the second flat electrical conductor, where the second tubular hook is physically and electrically connected to the second radial extension. The first tubular hook and second tubular hook are located within a first plane and the blocking diode is located in a second plane and the first radial extension includes a first bend from the first plane to the second plane and the second radial extension includes a second bend from the first plane to the second plane.

Also disclosed is a RSPM configured to be rollable. The RSPM includes a flexible substrate, a plurality of adjacent strings of photovoltaic ("PV") solar cells, and at least one end-tab jumper. The flexible substrate has a flexible substrate length and a top surface that defines a first plane. The plurality of adjacent strings of PV solar cells are attached on the top surface of the flexible substrate. Each PV solar cell has a perimeter that is a convex polygon. The plurality of adjacent strings are configured to be rollable along the flexible substrate length, where each adjacent string of the plurality of adjacent strings has an orientation along the flexible substrate length and each two adjacent strings of a pair of adjacent strings have orientations in opposite directions. The at least one end-tab jumper is physically and electrically connected to the plurality of adjacent strings, where the at least one end-tab jumper electrically connects the plurality of adjacent strings to form a series circuit.

Also disclosed is a method for fabricating the RSPM. The method includes attaching a plurality PV solar cells together to form a plurality of adjacent strings, attaching a plurality of end-tabs to each of the adjacent strings, and attaching at least one end-tab jumper to the plurality of end-tabs. The method also includes attaching two pickup-tabs to create a PV solar panel assembly and attaching the PV solar panel assembly to a flexible substrate.

Figure 1:
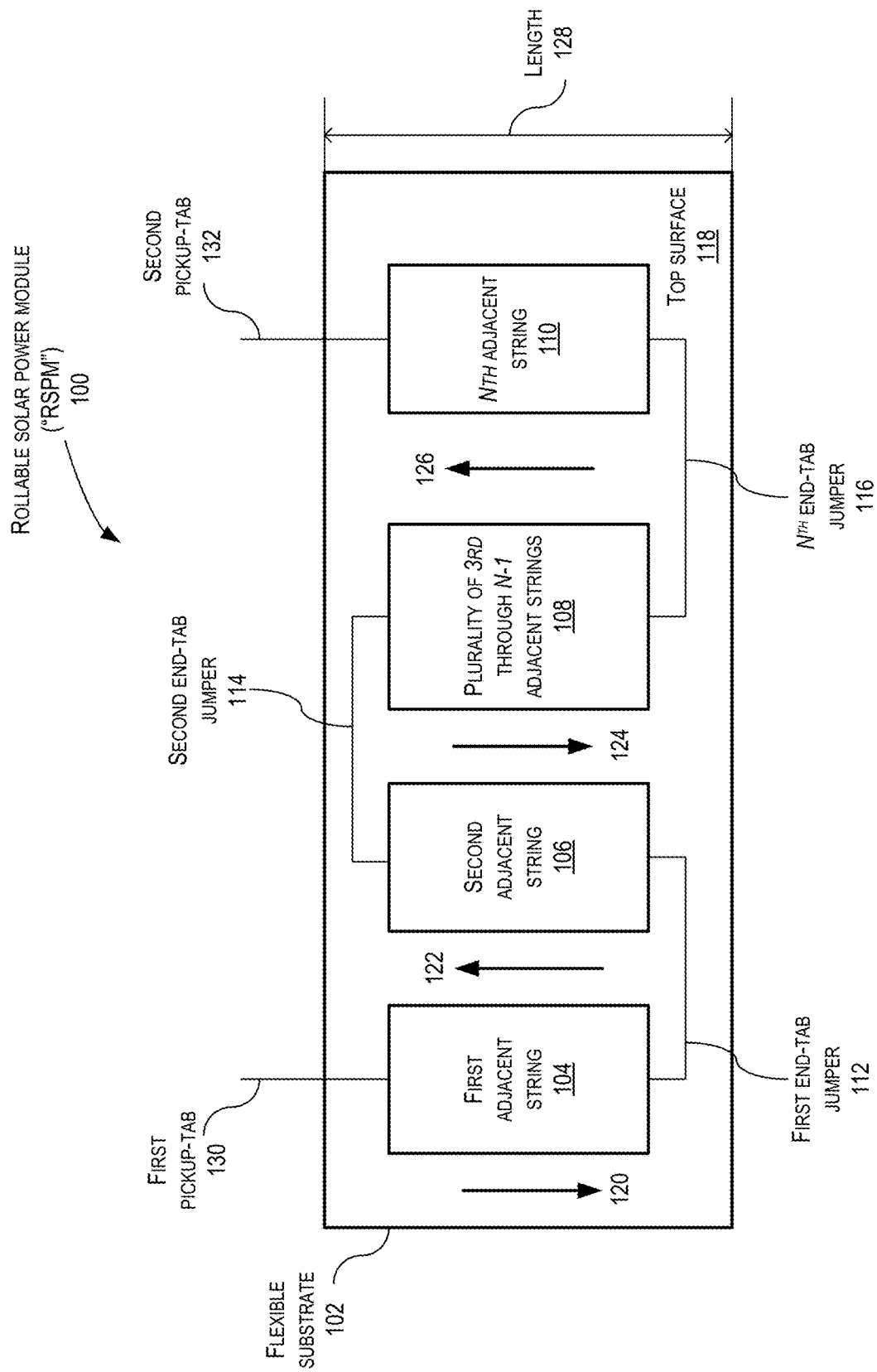
FIG. 1 is a block diagram of an implementation of a rollable solar power module ("RSPM") in accordance with the present disclosure.

In FIG. 1, a block diagram of an implementation of a RSPM 100 is shown in accordance with the present disclosure. In this example, the RSPM 100 includes a flexible substrate 102, a plurality of adjacent strings of solar cells (e.g., first adjacent string 104, second adjacent string 106, plurality of third (e.g. $3^{RD}$) through N−1 adjacent strings 108, and $N^{th}$ adjacent string 110), and a plurality of end-tab jumpers (e.g., first end-tab jumper 112, second end-tab jumper 114, and $N^{th}$ end-tab jumper 116). In the drawings, $3^{RD}$ and $N^{TH}$ are represented as 3RD and NTH for clarity. The plurality of adjacent strings of solar cells are integrated on a top surface 118 of the flexible substrate 102. In this example, there may be between two (2) to N adjacent strings 104, 106, 108, and 110 in the plurality of adjacent strings. For purposes of ease of illustration only four blocks of adjacent strings 104, 106, 108, and 110 are shown but it is appreciated by those of ordinary skill in the art that there may be any number of adjacent strings based on the design of the RSPM 100. In this example, the orientations 120, 122, 124, and 126 (e.g. directions) of each adjacent string 104, 106, 108, and 110 of the plurality of adjacent strings is along a length 128 of the flexible substrate 102 in alternating directions. As an example, the first adjacent string 104 and second adjacent string 106 form a pair of adjacent strings where the first adjacent string 104 has a first orientation 120 along the length 128 of the flexible substrate 102 in a first direction while the second adjacent string 106 has a second orientation 122 in an approximately opposite direction of the first direction. This pattern of adjacent string orientation directions is repeated for subsequent pairs of adjacent strings within the plurality of third through N−1 adjacent strings 108 ending with a pair of adjacent strings that includes the $N^{th}$ adjacent string 110. In this example, the third orientation 124 of a third adjacent string (not directly shown but within the third through N−1 adjacent strings 108) is in the opposite direction of the second orientation 122 direction 122 and the $N^{th}$ orientation 126 is in the opposite direction of a N−1 adjacent string (not directly shown but within the third through N−1 adjacent strings 108).

Furthermore, in this example, second adjacent string 106 is physically and electrically connected to the first adjacent string 104 with the first end-tab jumper 112 and the third adjacent string (within the third through N−1 adjacent strings 108) with the second end-tab jumper 114. Additionally, within the third through N−1 adjacent strings 108, other adjacent strings (not shown) will also be physically and electrically connected via other end-tab jumpers (not shown) in the same manner as the first end-tab jumper 112 and second end-tab jumper 114 physically and electronically connect the first adjacent string 104 through the third adjacent string (within the third through N−1 adjacent strings 108). Moreover, in the same manner, the N−1 adjacent string (within the third through N−1 adjacent strings 108) is physically and electrically connected to the $N^{th}$ adjacent string 110 via the $N^{th}$ end-tab jumper 116.

In this fashion, the plurality of adjacent strings (i.e., first adjacent string 104, second adjacent string 106, plurality of third through N−1 adjacent strings 108, and $N^{th}$ adjacent string 110) are electrically connected in series. Additionally, in this example, a first pickup-tab 130 is physically and electrically connected to the first adjacent string 104 and a second pickup-tab 132 is physically and electrically connected to the first adjacent string 104 such that an electrical series circuit is formed between the first pickup-tab 130 and the second pickup-tab 132.

In this example, each adjacent string 104, 106, 108, and 110 of the plurality of adjacent strings may include a plurality of end-tabs (not shown), a plurality of PV solar cells (not shown), and a plurality of end-tabs (not shown). In general, each adjacent string will include a first end-tab, a plurality of PV solar cells, and a second end-tab, where the plurality of PV solar cells will be physically and electrically connected in series between the first end-tab and second end-tab. Each adjacent string 104, 106, 108, and 110 will also include a plurality of adjacent string in-plane interconnects that physically and electrically connect the first end-tab to a first PV solar cell of the plurality of PV solar cells (with a first plurality of adjacent string in-plane interconnects of the plurality of adjacent string in-plane interconnects) and the second end-tab to the last PV solar cell of the plurality of PV solar cells (with a second plurality of adjacent string in-plane interconnects of the plurality of adjacent string in-plane interconnects). Additionally, the plurality of adjacent string in-plane interconnects will include at least a third plurality of adjacent string in-plane interconnects that physically and electrically connect the individual PV solar cells between the first and last PV solar cells and to each other PV solar cell in a serial fashion along the length 128 of the flexible substrate 102 in a given orientation for a corresponding adjacent string.

In this example, the plurality of PV solar cells, plurality of adjacent string in-plane interconnects, and plurality of end-tabs are configured to allow the RSPM 100 to be flexible enough so as be able to roll the RSPM 100, in the direction of the length 128, into a stowed position that has a cylindrical shape without damaging or shorting RSPM 100.

Figure 2:
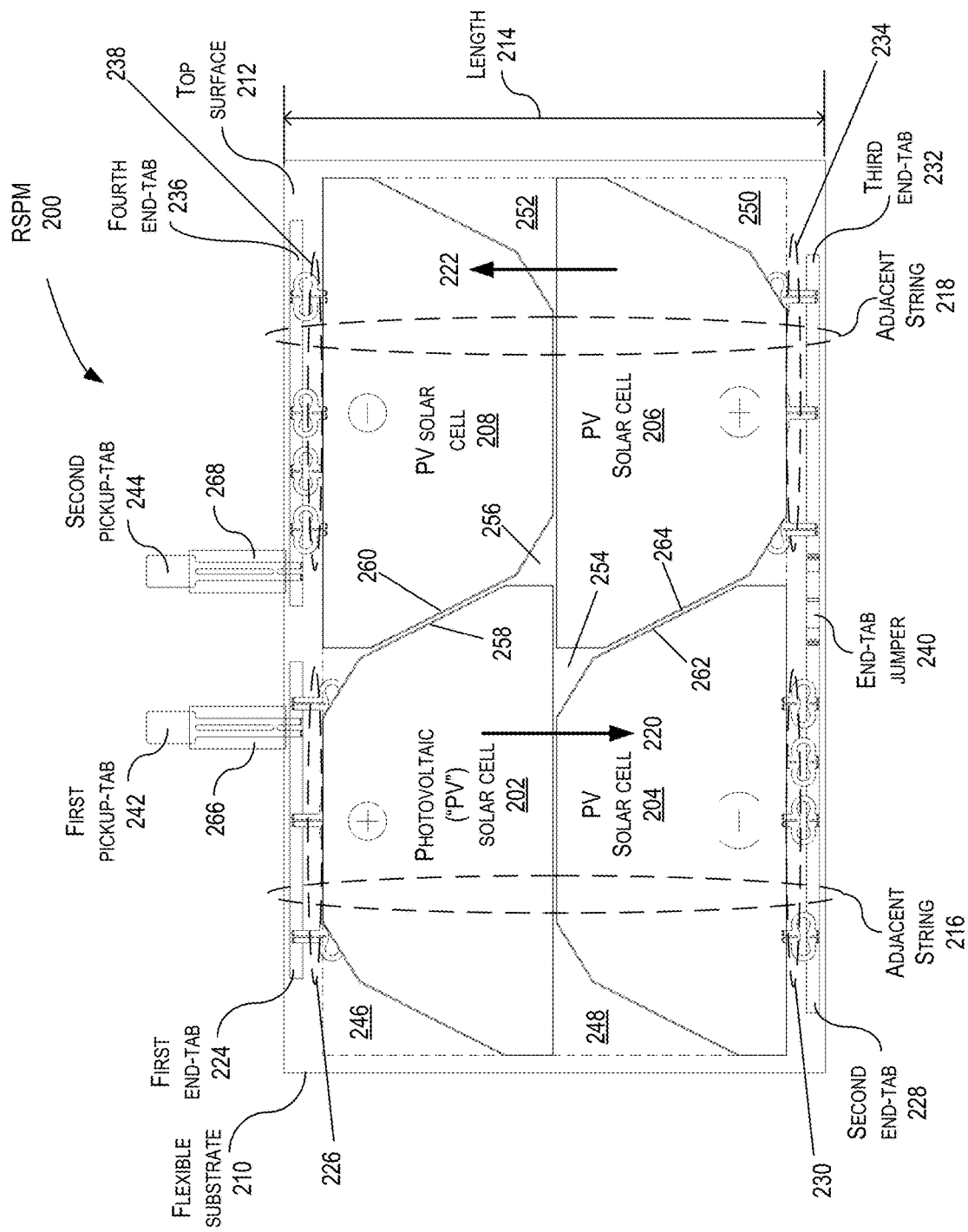
FIG. 2 is a top view of an example of an implementation of a 2×2 RSPM in accordance with the present disclosure.

FIG. 2 is a top view of an example of an implementation of a RSPM 200 in accordance with the present disclosure. For ease of illustration purposes, in this example, the RSPM 200 includes a two by two (i.e., a "2×2") layout of PV solar cells 202, 204, 206, and 208. The RSPM 200 also includes a flexible substrate 210 having a top surface 212 and a flexible substrate length 214. In this example, the plurality of PV solar cells 202, 204, 206, and 208 are laid out as two adjacent strings 216 and 218 along the flexible substrate length 214. In this example, the first adjacent string 216 includes the first PV solar cell 202 and second PV solar cell 204, while the second adjacent string 218 includes the third PV solar cell 206 and fourth PV solar cell 208. The first adjacent string 216 and the second adjacent string 218 form a pair of adjacent strings. Moreover, the first adjacent string 216 has a first orientation 220 along the flexible substrate length 214 and the second adjacent string 218 has a second orientation 222 along the flexible substrate length 214 that is in the opposite direction than the first orientation 220.

In this example, the plurality of adjacent strings includes the first adjacent string 216 and the second adjacent string 218. The first adjacent string 216 includes the first PV solar cell 202 (of the plurality of PV solar cells 202, 204, 206, and 208), a first end-tab 224, and a first plurality of in-plane interconnects 226 of the first adjacent string 216 physically and electrically connecting the first end-tab 224 to the first PV solar cell 202. The first adjacent string 216 also includes a second PV solar cell 204 (of the plurality of PV solar cells 202, 204, 206, 208) and a second plurality of in-plane interconnects 230 of the first adjacent string 216 physically and electrically connecting the second PV solar cell 204 to the second end-tab 228. The second adjacent string 218 includes a third PV solar cell 206 (of the plurality of PV solar cells 202, 204, 206, 208), a third end-tab 232, and a first plurality of in-plane interconnects 234 of the second adjacent string 218 physically and electrically connecting the third end-tab 232 to the third PV solar cell 206. The second adjacent string 218 also includes a fourth PV solar cell 208 (of the plurality of PV solar cells 202, 204, 206, 208) and a second plurality of in-plane interconnects 238 of the second adjacent string 218 physically and electrically connecting the fourth PV solar cell 208 to the fourth end-tab 236.

Furthermore, in this 2×2 layout example, the first adjacent string 216 includes at least a third plurality of in-plane interconnects (not shown) of the first adjacent string 216 physically and electrically connecting the second PV solar cell 204 to the first PV solar cell 202 and the second adjacent string 218 includes at least a third plurality of second adjacent string 218 in-plane interconnects (not shown) physically and electrically connecting the fourth PV solar cell 208 to the third PV solar cell 206. If the layout of RSPM 200 is larger than the 2×2 layout, the first adjacent string 216 may include more than just the first PV solar cell 202 and second PV solar cell 204. As such, the first adjacent string 216 would include the third plurality of first adjacent string 216 in-plane interconnects (not shown) physically and electrically connecting the first PV solar cell 202 to another PV solar cell (not shown) within the first adjacent string 216. The first adjacent string 216 would then also include additional pluralities of first adjacent string 216 in-plane interconnects that would physically and electrically connect any other PV solar cells (not shown) between the first PV solar cell 202 and the second PV solar cell 204 to form a continuous string of PV solar cells (including first PV solar cell 202 and second PV solar cell 204) between the first end-tab 224 and the second end-tab 228 that together form an electrical series circuit from the first end-tab 224 to the second end-tab 228. Likewise, if the layout of RSPM 200 is larger than the 2×2 layout the second adjacent string 218 may include more than just the third PV solar cell 206 and fourth PV solar cell 208. As such, the second adjacent string 218 would include the third plurality of second adjacent string 218 in-plane interconnects (not shown) physically and electrically connecting the third PV solar cell 206 to another PV solar cell (not shown) within the second adjacent string 218. The second adjacent string 218 would then also include additional pluralities of second adjacent string 218 in-plane interconnects that would physically and electrically connect any other PV solar cells (not shown) between the third PV solar cell 206 and the fourth PV solar cell 208 to form a continuous string of PV solar cells (including third PV solar cell 206 and fourth PV solar cell 208) between the third end-tab 232 and the fourth end-tab 236 that together form an electrical series circuit from the third end-tab 232 to the fourth end-tab 236.

In these examples, the second end-tab 228 and third end-tab 232 are physically and electrically connected via an end-tab jumper 240 that may be, for example, gap welded to both the third end-tab 232 to the fourth end-tab 236. The RSPM 200 then includes a first pickup-tab 242 physically and electrically connected to first end-tab 224 and a second pickup-tab 244 physically and electrically connected to fourth end-tab 236. With the end-tab jumper 240 connected between the second end-tab 228 and third end-tab 232, the first adjacent string 216 and second adjacent string 218 form a combined electrical series circuit from the first pickup-tab 242 to the second pickup-tab 244.

As an example of implementation, each of the PV solar cells 202, 204, 206, and 208 is shown as having a parameter that is a convex polygon. Specifically in this example, each of the PV solar cells 202, 204, 206, and 208 is shown as having a parameter that is a "D" shaped eight (8) sided octagon, where the first adjacent string 216 has the first orientation 220 in a direction from the first end-tab 224 to the second end-tab 228 (along the length 214 of the flexible substrate 210) and the second adjacent string 218 has the second orientation 222 in a direction opposite the first direction 220 from the third end-tab 232 to the fourth end-tab 236 (also along the length 214 of the flexible substrate 210). It is appreciated by those of ordinary skill in the art that in this example the PV solar cells are shown as having a "D" shaped perimeter but other shaped parameters may also be utilized based on the design of the RSPM 200.

In this example, the first adjacent string 216 and second adjacent string 218 are placed adjacent to each other on the top surface 212 of the flexible substrate 210 such that spacing between the plurality of PV solar cells 202, 204, 206, and 208 approximately maximizes a surface area usage of the top surface 212 of the flexible substrate 210 leaving only small surface area gaps 246, 248, 250, 252, 254, and 256 along the top surface 212 that are "dead zones." The first adjacent string 216 and second adjacent string 218 form a pair of adjacent strings have orientations 220 and 222 in opposite directions. In this example, the first PV solar cell 202 has a first side 258 that is adjacent to a first side 260 of the fourth PV solar cell 208. The second PV solar cell 204 has a first side 262 that is adjacent to a first side 264 of the third PV solar cell 206. Moreover, the first-end tab 224 is electrically connected to the positive side of the first PV solar cell 202, the second end-tab 228 is electrically connected to the negative side of the second PV solar cell 204, the third end-tab 232 is electrically connected to the positive side of the third PV solar cell 206, and the fourth end-tab 236 is electrically connected to the negative side of the fourth PV solar cell 208. It is noted that the first pickup-tab 242 and second pickup-tab 244 include polyimide (such as, for example, KAPTON® registered to E.I. du Pont de Nemours and Company of Wilmington, Del.) film insulators 266 and 268, respectively, to protect the first pickup-tab 242 and second pickup-tab 244.

In this disclosure, the shape of the intersection between the top (i.e., the long edge) of one PV solar cell 202, 204, 206, and 208 with the bottom (i.e., the short edge) of another PV solar cell 202, 204, 206, and 208 improves rollability of the RSPM 200. Moreover, nesting (i.e., placing adjacent PV solar cells 202, 204, 206, and 208 together in an adjacent manner where bottom edges interlay with the top edges of other adjacent PV solar cells 202, 204, 206, and 208 enables higher utilization of the top surface 212 of the flexible substrate 210 and reduction of dead zones on the top surface 212. The plurality of in-plane interconnects between the PV solar cells 202, 204, 206, and 208 are aligned to avoid unevenness along the line of rolling the RSPM 200. As an example, by maintaining the short distance (i.e., length of the PV solar cell 202, 204, 206, and 208) to under three inches and having the surface area of the PV solar cell 202, 204, 206, and 208 be approximately 76.88 cm$^2$ will improve the utilization of the top surface 212 while preserving the ability to roll the RSPM 200 without breaking the PV solar cells 202, 204, 206, and 208.

Figure 3:
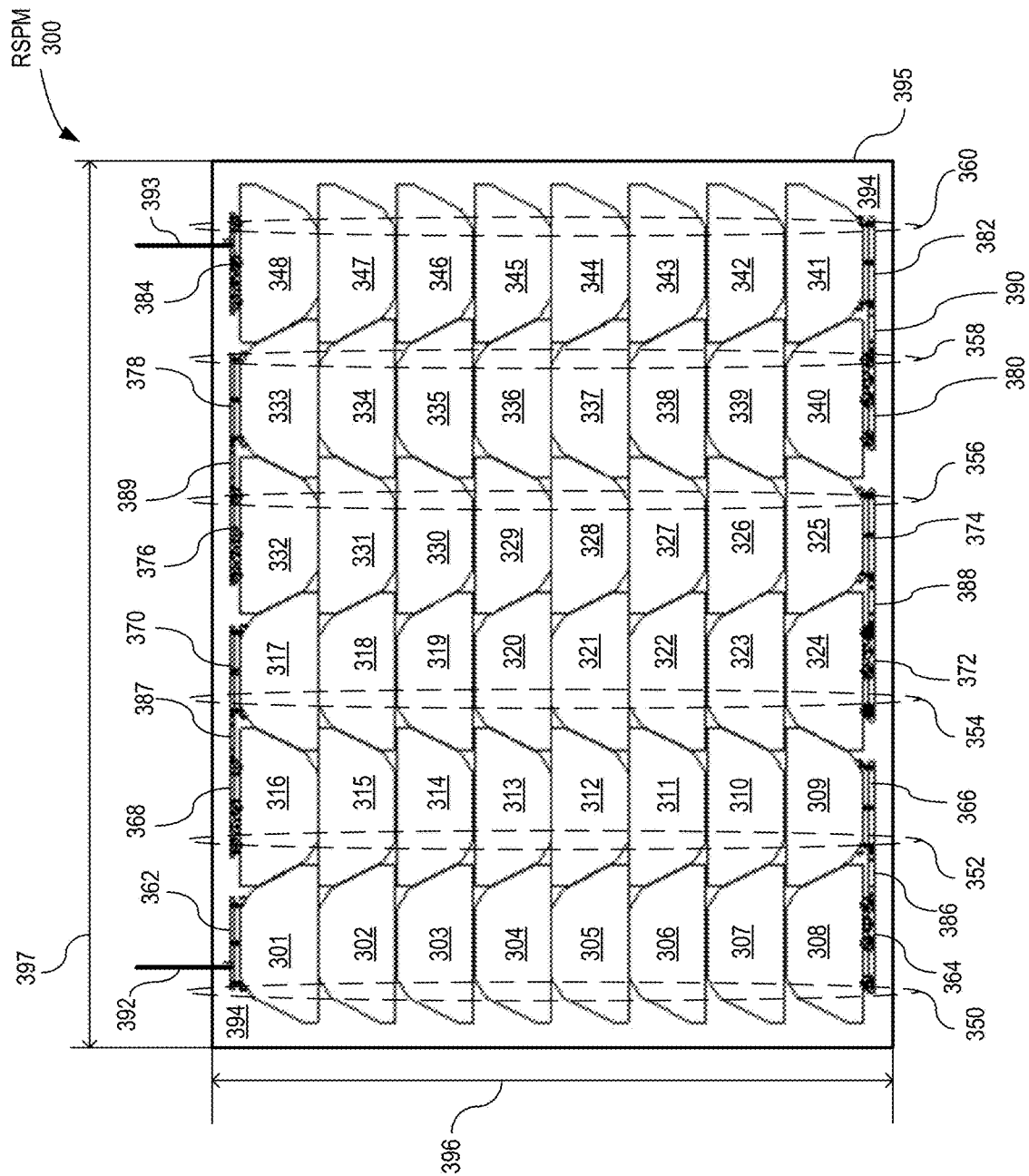
FIG. 3 is a top view of an example of an implementation of a RSPM having 48 photovoltaic ("PV") solar cells in accordance with the present disclosure.

Turning to FIG. 3, a top view of an example of an implementation of a RSPM 300 having 48 PV solar cells 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, and 348 is shown in accordance with the present disclosure. The 48 PV solar cells 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, and 348 are arranged within six (6) adjacent strings 350, 352, 354, 356, 358, and 360 having 6 PV solar cells each having two end-tabs, and a plurality of in-plane interconnects.

Specifically, the first adjacent string 350 includes a first end-tab 362, a second end-tab 364, and the PV solar cells 301, 302, 303, 304, 305, 306, 307, and 308. The first adjacent string 350 also includes a plurality of in-plane interconnects (not shown) that includes a sub-plurality of in-plane interconnects (not shown) physically and electrically connecting the first end-tab 362 to the first PV solar cell 301 and a second sub-plurality of in-plane interconnects (not show) physically and electrically connecting the second end-tab 364 to the eighth PV solar cell 308. The first adjacent string 350 also includes a third sub-plurality of in-plane interconnects (not shown) physically and electrically connecting the second PV solar cell 302 to the first PV solar cell 301, the seventh PV solar cell 307 to the eighth PV solar cell 308, and the remaining PV solar cells 303, 304, 305, and 306 to the second PV solar cell 302, seventh PV solar cell 307, and themselves. As such, the first adjacent string 350 is configured as an electrical series circuit from the first end-tab 362 to the second end-tab 364.

The second adjacent string 352 includes a first end-tab 366, a second end-tab 368, and the PV solar cells 309, 310, 311, 312, 313, 314, 315, and 316. The second adjacent string 352 also includes a plurality of in-plane interconnects (not shown) that includes a sub-plurality of in-plane interconnects (not shown) physically and electrically connecting the first end-tab 366 to the first PV solar cell 309 and a second sub-plurality of in-plane interconnects (not show) physically and electrically connecting the second end-tab 368 to the eighth PV solar cell 316. The second adjacent string 352 also includes a third sub-plurality of in-plane interconnects (not shown) physically and electrically connecting the second PV solar cell 310 to the first PV solar cell 309, the seventh PV solar cell 315 to the eighth PV solar cell 316, and the remaining PV solar cells 311, 312, 313, and 314 to the second PV solar cell 310, seventh PV solar cell 315, and themselves. As such, the second adjacent string 352 is also configured as an electrical series circuit from the first end-tab 366 to the second end-tab 368.

The third adjacent string 354 includes a first end-tab 370, a second end-tab 372, and the PV solar cells 317, 318, 319, 320, 321, 322, 323, and 324. The third adjacent string 354 also includes a plurality of in-plane interconnects (not shown) that includes a sub-plurality of in-plane interconnects (not shown) physically and electrically connecting the first end-tab 370 to the first PV solar cell 317 and a second sub-plurality of in-plane interconnects (not show) physically and electrically connecting the second end-tab 372 to the eighth PV solar cell 324. The third adjacent string 354 also includes a third sub-plurality of in-plane interconnects (not shown) physically and electrically connecting the second PV solar cell 318 to the first PV solar cell 317, the seventh PV solar cell 323 to the eighth PV solar cell 324, and the remaining PV solar cells 319, 320, 321, and 322 to the second PV solar cell 318, seventh PV solar cell 323, and themselves. As such, the third adjacent string 354 is also configured as an electrical series circuit from the first end-tab 370 to the second end-tab 372.

The fourth adjacent string 356 includes a first end-tab 374, a second end-tab 376, and the PV solar cells 325, 326, 327, 328, 329, 330, 331, and 332. The fourth adjacent string 356 also includes a plurality of in-plane interconnects (not shown) that includes a sub-plurality of in-plane interconnects (not shown) physically and electrically connecting the first end-tab 374 to the first PV solar cell 325 and a second sub-plurality of in-plane interconnects (not show) physically and electrically connecting the second end-tab 376 to the eighth PV solar cell 332. The fourth adjacent string 356 also includes a third sub-plurality of in-plane interconnects (not shown) physically and electrically connecting the second PV solar cell 326 to the first PV solar cell 325, the seventh PV solar cell 331 to the eighth PV solar cell 332, and the remaining PV solar cells 327, 328, 329, and 330 to the second PV solar cell 326, seventh PV solar cell 331, and themselves. As such, the fourth adjacent string 356 is also configured as an electrical series circuit from the first end-tab 374 to the second end-tab 376.

The fifth adjacent string 358 includes a first end-tab 378, a second end-tab 380, and the PV solar cells 333, 334, 335, 336, 337, 338, 339, and 340. The fifth adjacent string 358 also includes a plurality of in-plane interconnects (not shown) that includes a sub-plurality of in-plane interconnects (not shown) physically and electrically connecting the first end-tab 378 to the first PV solar cell 333 and a second sub-plurality of in-plane interconnects (not show) physically and electrically connecting the second end-tab 380 to the eighth PV solar cell 340. The fifth adjacent string 358 also includes a third sub-plurality of in-plane interconnects (not shown) physically and electrically connecting the second PV solar cell 334 to the first PV solar cell 333, the seventh PV solar cell 339 to the eighth PV solar cell 340, and the remaining PV solar cells 335, 336, 337, and 338 to the second PV solar cell 334, seventh PV solar cell 339, and themselves. As such, the fifth adjacent string 358 is also configured as an electrical series circuit from the first end-tab 378 to the second end-tab 380.

Moreover, the sixth adjacent string 360 includes a first end-tab 382, a second end-tab 384, and the PV solar cells 341, 342, 343, 344, 345, 346, 347, and 348. The sixth adjacent string 360 also includes a plurality of in-plane interconnects (not shown) that includes a sub-plurality of in-plane interconnects (not shown) physically and electrically connecting the first end-tab 382 to the first PV solar cell 341 and a second sub-plurality of in-plane interconnects (not show) physically and electrically connecting the second end-tab 384 to the eighth PV solar cell 348. The sixth adjacent string 360 also includes a third sub-plurality of in-plane interconnects (not shown) physically and electrically connecting the second PV solar cell 342 to the first PV solar cell 341, the seventh PV solar cell 347 to the eighth PV solar cell 348, and the remaining PV solar cells 343, 344, 345, and 346 to the second PV solar cell 342, seventh PV solar cell 347, and themselves. As such, the sixth adjacent string 360 is also configured as an electrical series circuit from the first end-tab 382 to the second end-tab 384.

The RSPM 300 also includes a plurality of end-tab jumpers 386, 387, 388, 389, and 390, where the first end-tab jumper 386 physically and electrically connects the second end-tab 364 of the first adjacent string 350 to the first end-tab 366 of the second adjacent string 352, the second end-tab jumper 387 physically and electrically connects the second end-tab 368 of the second adjacent string 352 to the first end-tab 370 of the third adjacent string 354, and the third end-tab jumper 388 physically and electrically connects the second end-tab 372 of the third adjacent string 354 to the first end-tab 374 of the second adjacent string 356. Additionally, the fourth end-tab jumper 389 physically and electrically connects the second end-tab 376 of the fourth adjacent string 356 to the first end-tab 378 of the fifth adjacent string 358 and the fifth end-tab jumper 390 physically and electrically connects the second end-tab 380 of the fifth adjacent string 358 to the first end-tab 382 of the sixth adjacent string 360. In this example, the RSPM 300 further includes a first pickup-tab 392 and second pickup-tab 393 where the first pickup-tab 392 is physically and electrically connected to the first end-tab 362 of the first adjacent string 350 and the second pickup-tab is physically and electrically connected to the second end-tab 393 of the sixth adjacent string 360. As such, the plurality of end-tab jumpers 386, 387, 388, 389, and 390 create an electrical series circuit from the plurality of adjacent strings 350, 352, 354, 356, 358, and 360 that has an electrical path from the first pickup-tab 392 to the second pickup-tab 393.

In this example, the 48 PV solar cells 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, and 348 are attached to top surface 394 of a flexible substrate 395, where PV solar cells corresponding to the six adjacent strings 350, 352, 354, 356, 358, and 360 are positioned along the length 396 of the flexible substrate 395. Moreover, the plurality of adjacent strings 350, 352, 354, 356, 358, and 360 are positioned along the width 397 of the flexible substrate 395 so as to minimize any "dead zones" (i.e., areas along the top surface 394 that are not covered by a PV solar cell) on the top surface 394 of the flexible substrate 395. In this example, the length of the individual in-plane interconnects are designed to align the position of the first end-tabs 362, 366, 370, 374, 378, and 382 and second-end tabs 364, 368, 372, 376, 380, and 384 and the position of rows of PV solar cells. In this example, the first row of PV solar cells includes PV solar cells 301, 316, 317, 332, 333, and 348; the second row of PV solar cells includes PV solar cells 302, 315, 318, 331, 334, and 347; the third row of PV solar cells includes PV solar cells 303, 314, 319, 330, 335, and 346; the fourth row of PV solar cells includes PV solar cells 304, 313, 320, 329, 336, and 345; the fifth row of PV solar cells includes PV solar cells 305, 312, 321, 328, 337, and 344; the sixth row of PV solar cells includes PV solar cells 306, 311, 322, 327, 338, and 343; the seventh row of PV solar cells includes PV solar cells 307, 310, 323, 326, 339, and 342; the eighth row of PV solar cells includes PV solar cells 308, 309, 324, 325, 340, and 341.

As an example, the flexible substrate 395 may be a 2-millimeter sheet of flexible polyimide film such as KAPTON®. The plurality of PV solar cells may be bonded on to the top surface 394 of the flexible substrate 395 utilizing a bonding adhesive (for example CV-2568 adhesive produced by NuSil Technology LLC of Carpinteria, Calif.). In this example, the length 396 of the flexible substrate 395 may be approximately 23 inches and the width 397 may be approximately 31 inches. If each PV solar cells is assembled as a solar cell plus interconnects plus coverglass ("CIC") produced by Spectrolab, Inc. of Sylmar, Calif., the size of the CIC may be approximately 13 cm wide by approximately 6.25 cm in length having a surface area of approximately 76.88 cm$^2$. The CIC may be, for example, a XTJ Prime solar cell produced by Spectrolab, Inc. of Sylmar, Calif. In this example, the approximate size of a tightly space array of PV solar cells may be approximately 28.87 inches wide by 22.26 inches in length, resulting in a small amount of dead zones (approximately less than 10%) on the top surface 394 of the flexible substrate 395.

In this example, the first pickup tab 392 and second pickup tab 393 may each be a silver clad nickel-cobalt ferrous alloy (such as KOVAR® produced by CRS Holdings, Inc. of Wilmington, Del.) tab that is utilized to electrically connect the RSPM 300 into other circuitry external to RSPM 300 so as to route RSPM 300 generated power from the RSPM 300 to an external power harness (not shown). Moreover, each end-tab jumper (also known as a turn-around jumper) 386, 387, 388, 389, and 390 may also be constructed of silver clad nickel-cobalt ferrous alloy (such as KOVAR® produced by CRS Holdings, Inc. of Wilmington, Del.). In this example, prior to bonding the PV solar cells 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, and 348 on the top surface 394 of the flexible substrate 395, the end-tab jumpers 386, 387, 388, 389, and 390 are attached to the corresponding end-tabs 362, 364, 366, 368, 370, 372, 374, 376, 378, and 380, respectively, utilizing for example welding.

Figure 4:
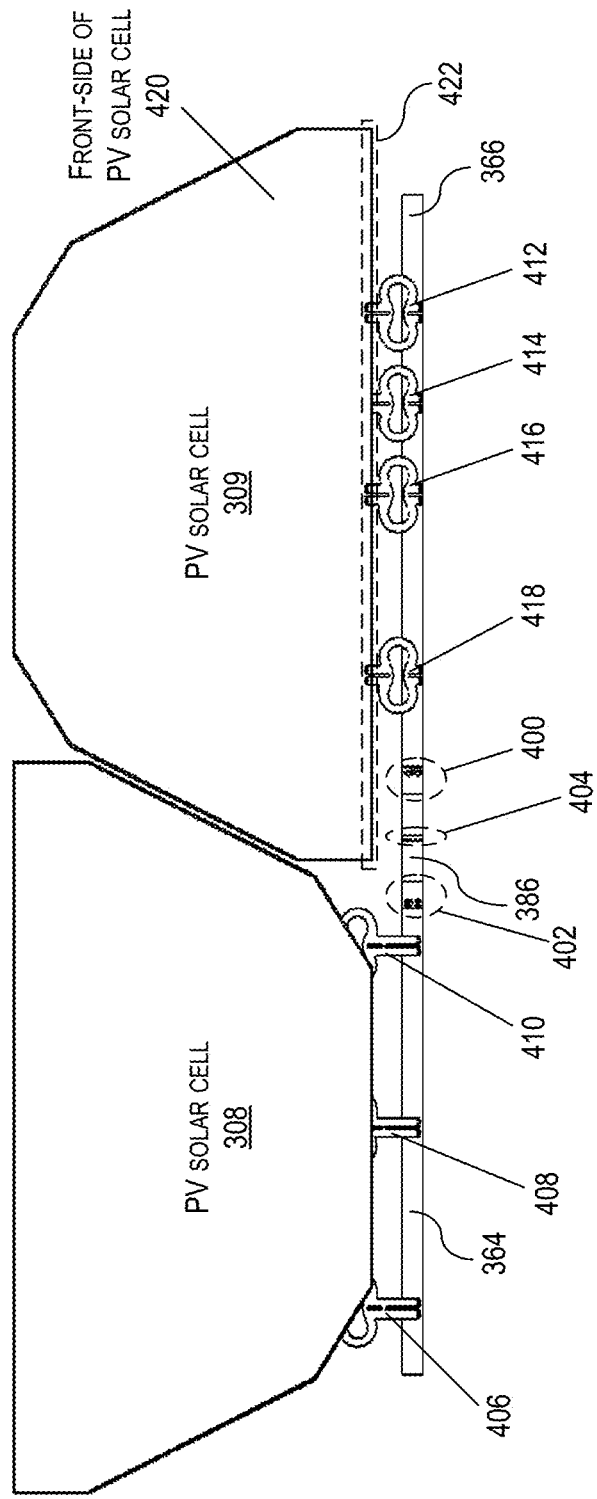
FIG. 4 is a zoomed in top view of the RSPM shown in FIG. 3 illustrating a first end-tab, a second end-tab, and an end-tab jumper in accordance with the present disclosure.

In FIG. 4, a zoomed in top view of the RSPM 300 illustrating the first end-tab 366 of the second adjacent string 352, the second end-tab 364 of the first adjacent string 350, and the first end-tab jumper 386 in accordance with the present disclosure. In this example, first end-tab jumper 386 is shown attached by welding the first end-tab jumper 386 to both the first end-tab 366 and the second end-tab 364 at welded contacts 400 and 402, respectively, prior to bonding the eighth PV solar cell 308 and first PV solar cell to the top surface 394 of the flexible substrate 395. As an example, the first end-tab jumper 386 may have a length of approximately 1.588 inches and the welded contacts 400 and 402 may each have approximately 0.100 inches of overlap between the ends of the first end-tab jumper 386 and the ends of both the first end-tab 366 and the second end-tab 364, respectively. In this example, the first end-tab jumper 386 may include one or more stress relief loops 404 to allow for mechanical stress relief from any forces pulling at the ends of the first end-tab jumper 386.

In this example, a plurality of in-plane interconnects are also shown physically and electrically connecting the eighth PV solar cell 308 and first PV solar cell 309 to the second end-tab 364 and the first end-tab 366, respectively. Specifically, the eighth PV solar cell 308 includes a first, second, and third in-plane interconnect 406, 408, and 410 physically and electrically connecting the eighth PV solar cell 308 to the second end-tab 364 and the first PV solar cell 309 includes a first, second, third, and fourth in-plan interconnect 412, 414, 416, and 418 physically and electrically connecting the first PV solar cell 309 to the first end-tab 366. In this example, the second end-tab 364, first end-tab 366, first end-tab jumper 386, and in-plane interconnects 406, 408, 410, 412, 414, 416, and 418 may be over-coated with adhesive and/or $SiO_2$ to ensure that these components are not exposed so as to mitigate against the effects of atomic oxygen and plasma-induced arcing.

It is appreciated that in order to keep the eighth PV solar cell 308 and first PV solar cell 309 in alignment, the second end-tab 364 and the first end-tab 366 are utilized in combination with the in-plane interconnects 406, 408, 410, 412, 414, 416, and 418. In this example, the lengths of the in-plane interconnects 406, 408, and 410 associated with the eighth PV solar cell 308 are different than the lengths of the in-plane interconnects 412, 414, 416, and 418 associated with the first PV solar cell 309 because in-plane interconnects 406, 408, 410, 412, 414, 416, and 418 are trimmed to achieve a predetermined equivalent length for each adjacent string.

In general, the plurality of in-plane interconnects (including in-plane interconnects 406, 408, 410, 412, 414, 416, and 418) allow the plurality of adjacent strings 350, 352, 354, 356, 358, and 360 to be tab aligned with the plurality of end-tabs 362, 364, 366, 368, 370, 372, 374, 376, 378, 380, 382, and 384. This results in ease of manufacturing of the circuit assemblies of the RSPM 300 that facilitates manufacturing automation because the in-plane interconnects are positioned such that the end-tabs are aligned within an interconnected circuit (i.e., the created series circuit of the RSPM 300) and thus enables ease of connecting the adjacent strings 350, 352, 354, 356, 358, and 360 to complete the interconnected circuit (i.e., the series circuit). As such, in general utilizing the disclosed end-tabs an in-plane interconnects allows the creation of a series circuit that includes a plurality of PV solar cells connected in series via the plurality of in-plane interconnects to form a plurality of adjacent strings that are in parallel and where the adjacent strings include end-tabs positioned at the end of each of the adjacent strings. This approach not only provides for ease of automation but also assists with rolling the components of a given adjacent string (e.g., 350, 352, 354, 356, 358, or 360) or the entire RSPM 300. The end-tab jumpers electrically connect the end-tabs such that the adjacent strings are in electrical series and the end-tabs are in physically alignment on the top surface 394 of the flexible substrate 395.

In this example, the first in-plane interconnect 412, third in-plane interconnect 416, and fourth in-plane interconnect 418 from the first PV solar cell 309 to the first end-tab 366 are physically and electrically connected to a front-side surface 420 of the first PV solar cell 309. Moreover, the second in-plane interconnect 414 from the first PV solar cell 309 to the first end-tab 366 is an in-plane interconnect that is physically and electrically connected to a bypass diode (not shown) on the backside of the first PV solar cell 309.

Figure 5A:
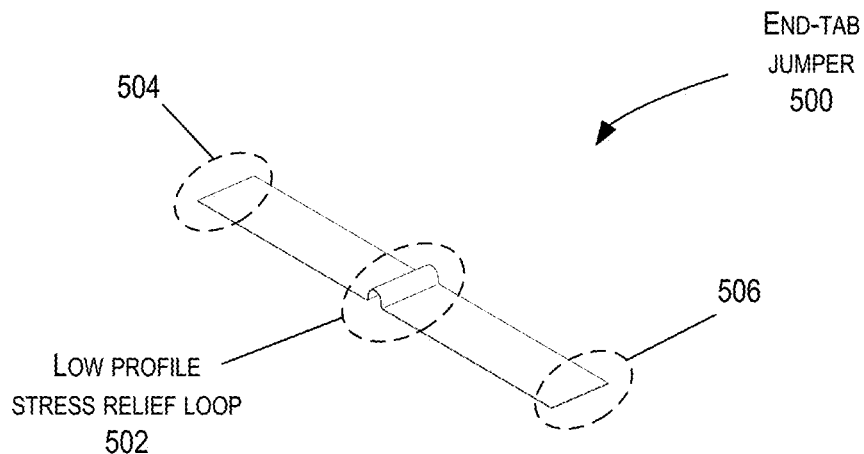
FIG. 5A is a perspective view of an example of an implementation of an end-tab jumper in accordance with the present disclosure.
Figure 5B:
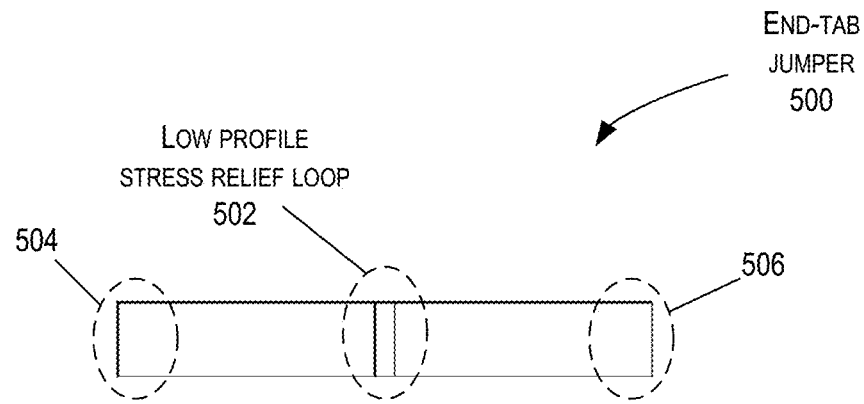
FIG. 5B is a top view of the end-tab jumper shown in FIG. 5A in accordance with the present disclosure.
Figure 5C:
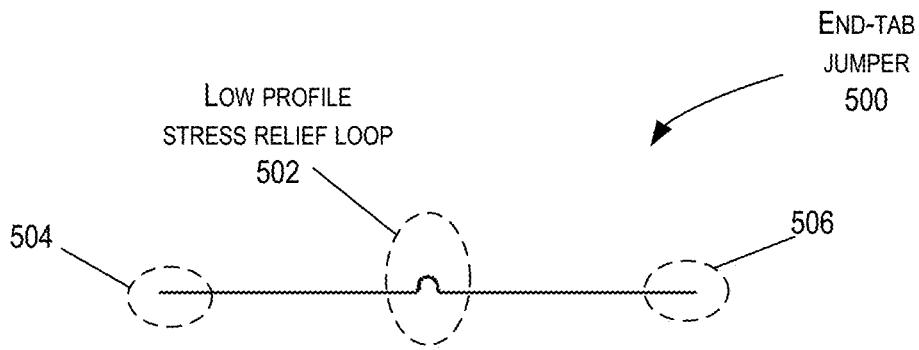
FIG. 5C is a side view of the end-tab jumper shown in FIGS. 5A and 5B in accordance with the present disclosure.

Turning to FIGS. 5A-5C, an example of an end-tab jumper 500 is shown in accordance with the present disclosure. Specifically, in FIG. 5A, a perspective view of an example of an implementation of the end-tab jumper 500 is shown in accordance with the present disclosure. In FIG. 5B, a top view of the end-tab jumper 500 is shown in accordance with the present disclosure and in FIG. 5C, a side view of the end-tab jumper 500 is shown in accordance with the present disclosure. In this example, the end-tab jumper 500 includes at least one low profile stress relief loop 502 and a first overlap area 504 and second overlap area 506 for welded contact with the aligned end-tabs (not shown). In this example, the first overlap area 504 and second overlap area 506 correspond to the weld contacts 400 and 402 shown in FIG. 4. Similarly, the low-profile stress relief loop 502 corresponds to the stress relief loop 404 shown in FIG. 4.

Figure 6A:
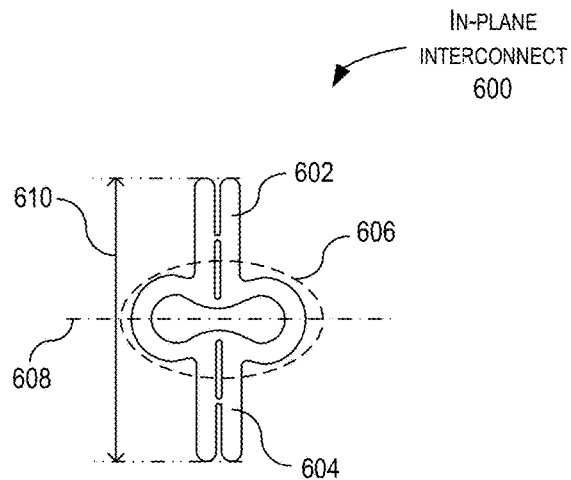
FIG. 6A is a top view of an example of an implementation of an in-plane interconnect in accordance with the present disclosure.

In FIG. 6A, a top view of an example of an implementation of an in-plane interconnect 600 (e.g., 412, 414, 416, or 418) is shown in accordance with the present disclosure. The in-plane interconnect 600 includes a first tab 602, second tab 604, and a stress relief section shaped as an "infinity loop" or oval (also known as an "infinity tab of the in-plane interconnect" but herein referred to as infinity interconnect 606). The in-plane interconnect 600 is a flat, low profile interconnect tab that provides stress relief and functionality as compared with out-of-plane stress relief interconnects. In this example, first tab 602 and second tab 604 are ends of the in-plane interconnect 600 that have a plurality of "toes" (i.e., parallel portions of the first tab 602 and second tab 604). The infinity interconnect 606 are stress relief sections on the in-plane interconnect 600 that allows flexing along an imaginary hinge positioned on an imaginary central axis 608 found on the planar surface of the in-plane interconnect 600 and intersecting a midpoint of the infinity interconnect 606. As an example, infinity interconnect 606 provides stress relief over a wide temperature range that may be, for example, between approximately −175° C. to approximately 155° C. As disclosed, the in-plane interconnect 600 will not be damaged if flexed by rolling the RSPM, nor will the in-plane interconnect 600 cause electrical shorts or physical kink in the in-plane interconnect 600. In this example, the in-plane interconnect 600 has a first length 610.

Figure 6B:
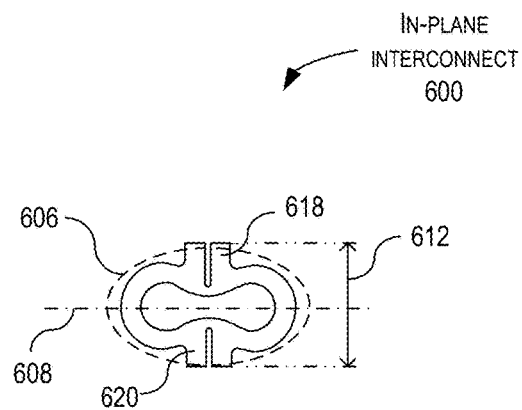
FIG. 6B is a top view of an example of an implementation of a first trimmed in-plane interconnect in accordance with the present disclosure.
Figure 6C:
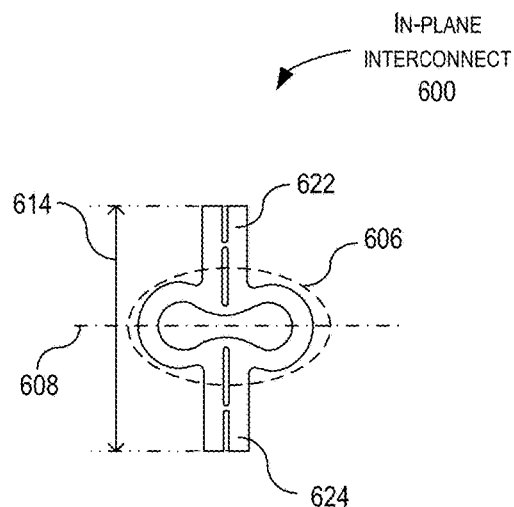
FIG. 6C is a top view of an example of an implementation of a second trimmed in-plane interconnect in accordance with the present disclosure.

FIG. 6B is a top view of an example of an implementation of the in-plane interconnect 600 trimmed to a second length 612 in accordance with the present disclosure. In FIG. 6C, the in-plane interconnect 600 is shown trimmed to a third length 614 and in FIG. 6D, the in-plane interconnect 600 is shown trimmed to a fourth length 616.

Turning back to FIG. 4, it is appreciated that the first length of the first, second, and third in-plane interconnects 406, 408, and 410 of the eighth PV solar cell 308 is different from the second length of the first, third, and fourth in-plane interconnects 412, 416, and 418 and the third length of the second in-plane interconnect 414. The reason for these different lengths is to properly align the eighth PV solar cell 308 and first PV solar cell 309 to the aligned second end-tab 364 of the first adjacent string 350 and first end-tab 366 of the second adjacent string 352. In other words, the first, second, and third in-plane interconnects 406, 408, and 410 of the eighth PV solar cell 308 have the first length that is designed to properly electrically connect the second end-tab 364 to the backside of the eighth PV solar cell 308 so as to complete the series circuit of the first adjacent string 350 while the first, third, and fourth in-plane interconnects 412, 414, and 418 have the second length that is designed to properly electrically connect the first end-tab 366 to the an edge 422 of the front-side 420 of the first PV solar cell 309 so as to complete the series circuit of the second adjacent string 352. In this example, the second in-plane interconnect 414 has the third length (which may be different than the second length of the first, third, and fourth in-plane interconnects 412, 414, and 418) because the second in-plane interconnect 414 is designed to electrically connect the first end-tab 366 to a bypass diode (not shown) on the backside of the first PV solar cell 309.

Figure 6D:
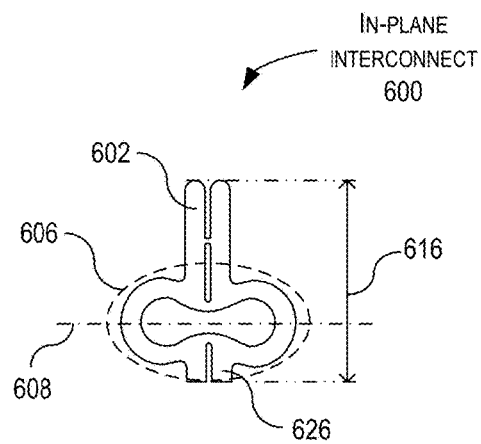
FIG. 6D is a top view of an example of an implementation of a third trimmed in-plane interconnect in accordance with the present disclosure.

Turning back to FIGS. 6A through 6D, the lengths 610, 612, 614, and 616 of the in-plane interconnect 600 are predetermined by the design of the adjacent strings in the RSPM. As an example, the first, second, and third in-plane interconnects 406, 408, and 410 of the eighth PV solar cell 308 (as shown) may have the first length 610 or third length 614 as shown in FIGS. 6A and 6C. While, the first, third, and fourth in-plane interconnects 412, 414, and 418 of the first PV solar cell 309 (as shown) may have the second length 612 as shown in FIG. 6B. Moreover, the second in-plane interconnect 414 of the first PV solar cell 309 (as shown) may have fourth length 616 as shown in FIG. 6D. In this example, these different lengths 610, 612, 614, and 616 may be fabricated by trimming the respective lengths to predetermined length values determined by the design of the RSPM. As an example, if the in-plane interconnect 600 is fabricated in quantity having a default original length value, the first length 610 is assumed to be the original length value. The second length 612 is then fabricated by trimming the first tab 602 and second tab 604 by a predetermined trim amount that is based on the design of the RSPM. This trimming produces a third tab 618 and fourth tab 620. Similarly, if original length (i.e., the first length) is too large for a given design, the trimming may also produce a fifth tab 622 and sixth tab 624. Moreover, in FIG. 6D, the fourth length 616 may be produced by trimming only one of the original tabs (i.e., either first tab 602 or second tab 604) based on the design of the RSPM. In this example, the second tab 604 is shown as having been trimmed to produce a seventh tab 626. Alternatively, the first tab may have been trimmed instead of the second tab 604 without altering the purpose of the design. Furthermore, other combinations of predetermined amounts of trimmed values of the first tab 602 and second tab 604 may be utilized based on the desired design of the RSPM.

Figures 7, 8:
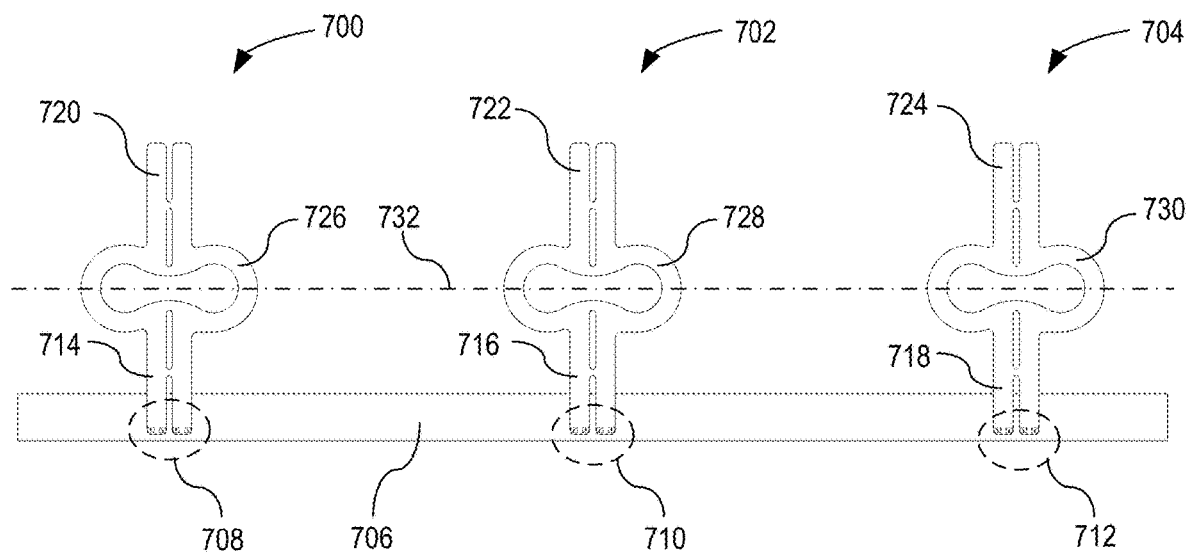
FIG. 7 is a top view of an example of an implementation of in-plane interconnects attached to the end-tab in accordance with the present disclosure.
FIG. 8 is a top view of an example of an implementation of an end-tab in accordance with the present disclosure.

In FIG. 7, a top view of an example of an implementation of in-plane interconnects 700, 702, and 704 attached to the end-tab 706 is shown in accordance with the present disclosure. In this example, the in-plane interconnects 700, 702, and 704 may be the first, second, and third in-plane interconnects 406, 408, and 410 of the eighth PV solar cell 308 shown in FIG. 4. In this example, the in-plane interconnects 700, 702, and 704 are attached to the end-tab 706 via weld points 708, 710, and 712 at a first tab 714, second tab 716, and third tab 718 (of the in-plane interconnects 700, 702, and 704), respectively. The in-plane interconnects 700, 702, and 704 also include a fourth tab 720, fifth tab 722, sixth tab 724, first infinity interconnect 726, second infinity interconnect 728, and third infinity interconnect 730, respectively.

As discussed earlier, the infinity interconnects 726, 728, and 730 are stress relief sections on the in-plane interconnects 700, 702, and 704 that allows flexing along an imaginary hinge positioned on an imaginary central axis 732 found on the planar surface of the in-plane interconnects 726, 728, and 730 and intersecting midpoints of the infinity interconnects 726, 728, and 730. In general, the in-plane interconnects 700, 702, and 704 (and other variations of in-plane interconnects based on predetermined trimming of the tabs of the in-plane interconnects as described in relation to FIGS. 6A-6D) are trimmed to predetermined lengths so as to produce an alignment of end-tabs at the each of each adjacent string. This is accomplished by trimming the in-plane interconnects 700, 702, and 704 to achieve a predetermined equivalent length for each adjacent string. As such, the in-plane interconnects 700, 702, and 704 are positioned to allow flex along the imaginary central axis 732. Once the lengths are predetermined, the end-tab jumpers (e.g., end-tab jumper 500) are utilized to physically and electrically connect adjacent end-tabs of the adjacent strings to each other. This results in layouts of components of the RSPM that have ease of automation for fabrication and assist with rolling the components of the RSPM. As such, utilizing this approach, the RSPM includes circuits that have a series of PV solar cells that are interconnected via a plurality of in-plane interconnects to form a series of adjacent strings in parallel, where the adjacent strings include end-tabs positioned at the end of each adjacent string and adjacent strings are parallel to each other. End-tab jumpers then connect the end-tabs to each other such that the adjacent strings are in electrical series and the end-tabs are physically aligned with each other.

Figure 9:
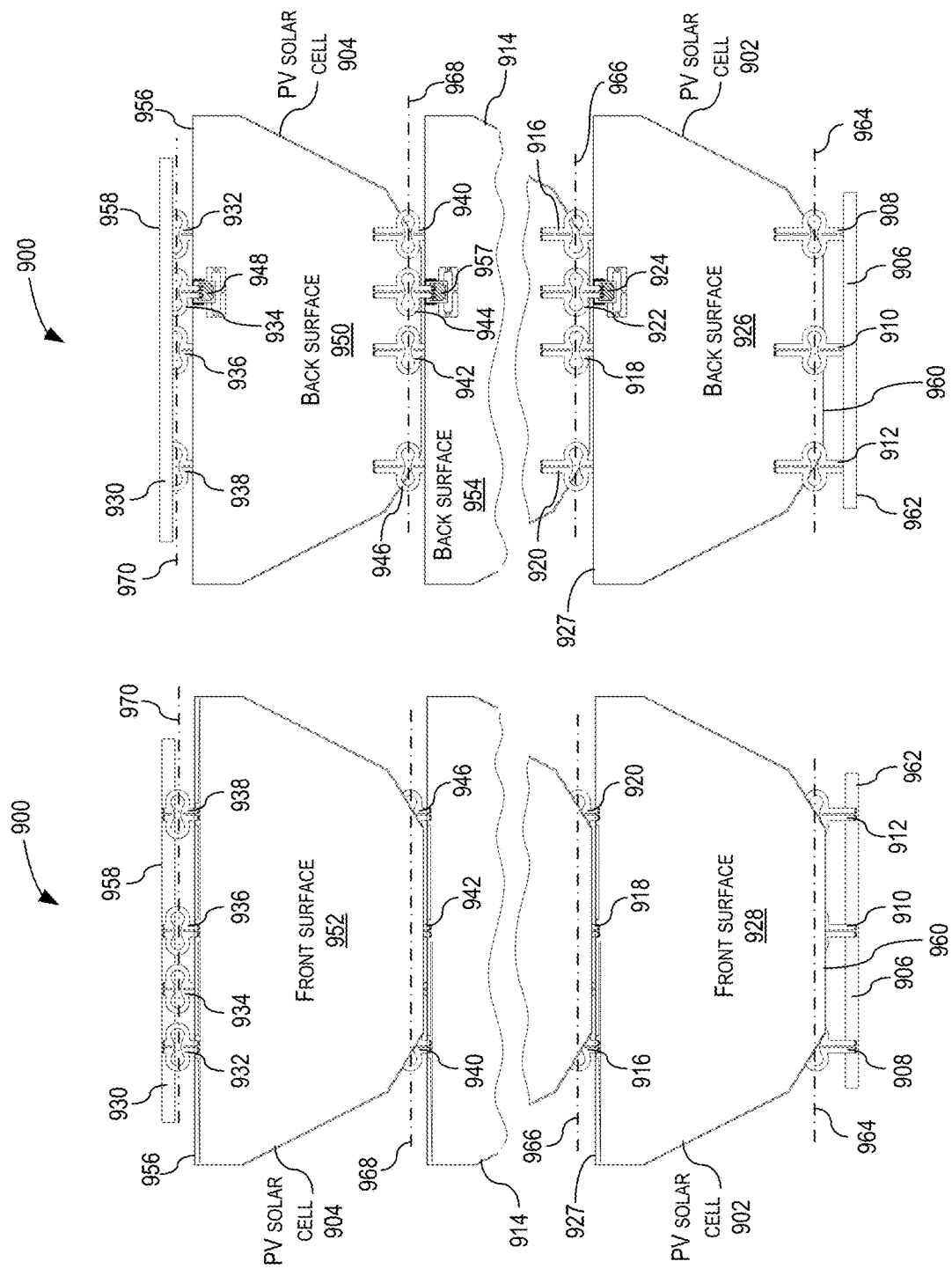
FIG. 9A is a front view of an example of an implementation of an adjacent string of a plurality of PV solar cells in accordance with the present disclosure.
FIG. 9B is a back view of an example of an implementation of an adjacent string of a plurality of PV solar cells in accordance with the present disclosure.

In FIG. 8, a top view of an example of an implementation of an end-tab 800 is shown in accordance with the present disclosure. In general, the end-tab 800 is a flat piece of metal that may be a prefabricated blank before stamping Turning to FIG. 9A, a front view of an example of an implementation of an adjacent string 900 of a plurality of PV solar cells is shown in accordance with the present disclosure. In this example, the two PV solar cells 902 and 904 of the plurality of PV solar cells are shown for ease of illustration; however, it is appreciated that the number of PV solar cells may be any number greater than two. In FIG. 9B, a back view of the implementation of the adjacent string 900 of the plurality of PV solar cells (i.e., including PV solar cells 902 and 904) is shown in accordance with the present disclosure.

In this example, the first PV solar cell 902 is physically and electrically connected to the first end-tab 906 via in-plane interconnects 908, 910, and 912 and one or more PV solar cells 914 via in-plane interconnects 916, 918, 920, and 922, respectively. Moreover, the in-plane interconnect 922 is physically and electrically connected to the bypass diode 924 on the back surface 926 of the first PV solar cell 902. Furthermore, the in-plane interconnects 908, 910, and 912 are physically and electrically connected to circuitry (not shown) on the back surface 926 of the first PV solar cell 902 and the in-plane interconnects 916, 918, and 920 are physically and electrically connected to an edge 927 of the front surface 928 of the first PV solar cell 902.

Similarly, the second PV solar cell 904 is physically and electrically connected to the second end-tab 930 via in-plane interconnects 932, 934, 936, and 938 and the one or more PV solar cells 914 via in-plane interconnects 940, 942, 944, and 946, respectively. Moreover, the in-plane interconnect 934 is physically and electrically connected to the bypass diode 948 on the back surface 950 of the second PV solar cell 904. Furthermore, the in-plane interconnects 932, 936, and 938 are physically and electrically connected to an edge 956 of the front surface 952 of the second PV solar cell 904. Furthermore, the in-plane interconnects 940, 942, 944, and 946 are physically and electrically connected to circuitry (not shown) on the back surface 950 of the second PV solar cell 904 and the in-plane interconnects 916, 918, 920, and 922 are physically and electrically connected to a back surface 954 of the one or more PV solar cells 914. The in-plane interconnect 944 is physically and electrically connected to the bypass diode 957 of the one or more PV solar cells 914.

In this example, the in-plane interconnects 908, 910, 912, 916, 918, 920, 922, 932, 934, 936, 938, 940, 942, 944, and 946 may have different lengths as described earlier with regard to FIGS. 6A-6D. For example, assuming (as described earlier) PV solar cells having a size of approximately 13 cm in width, approximately 6.25 cm in length, and approximately 76.88 cm² in surface area, the in-plane interconnects 940, 942, and 946 may have a length of approximately 0.659 inches with a shape similar to the in-plane interconnect 600 shown in FIG. 6A. The in-plane interconnects 908, 910, and 912 may have a length of approximately 0.931 inches (with a shape similar to the in-plane interconnect 600 shown in FIG. 6D) and the in-plane interconnect 922 to the bypass diode 924 may have a length of approximately 0.730 inches with a shape similar to in-plane interconnect 600 shown in FIG. 6C. Moreover, the distance from the edge 956 of the second PV solar cell 904 to the outer edge 958 of the second end-tab 930 may be approximately 0.377 inches where the weld points of the in-plane interconnects 932, 934, 936, and 938 are located approximately 0.020 inches from the outer edge 958 of the second end-tab 930 and approximately 0.051 inches from the edge 956 of the second PV solar cell 904. Furthermore, the distance from the edge 960 of the first PV solar cell 902 to the outer edge 962 of the first end-tab 906 may be approximately 0.377 inches.

It is appreciated by those of ordinary skill in the art that the bypass diodes 924, 948, and 957 are devices that allow the different PV solar cells to continuously pass a current through a specific adjacent string of PV solar cells. Specifically, when some of the PV solar cells are shaded or not receiving as much solar energy as other PV solar cells connected in series, the PV solar cells receiving greater solar energy will produce a greater current than the PV solar cells that are producing less current because of the low amount of received solar energy. The result without the use of bypass diodes is that the high current producing PV solar cells will force the lower current producing PV solar cells to pass more current than the lower current producing PV solar cells can handle since they are all connected in series and the current in a series circuit is the same throughout the circuit. This may result in damage to the lower current producing PV solar cells or in a region of negative voltage that will cause a net voltage loss to the system. The bypass diodes prevent this situation by allowing current to pass around the lower current producing PV solar cells in a parallel circuit that reduces the voltage losses through the lower current producing PV solar cells.

In this example, each of the sets of in-plane interconnects are physically aligned such that each set of in-plan interconnects has an imaginary central axis that allows for flexing the in-plane interconnects around these imaginary central axes. Specifically, the first set of in-plane interconnects 908, 910, and 912 have a first imaginary central axis 964. The second set of in-plane interconnects 916, 918, 920, and 922 have a second imaginary central axis 966. The third set of in-plane interconnects 940, 942, 944, and 946 have a third imaginary central axis 968 and the fourth set of in-plane interconnects 932, 934, 936, and 938 have a fourth imaginary central axis 970. These imaginary axes 956, 958, 960, and 962 assist in allowing the adjacent string 900 to be flexed and rolled.

Figure 10:
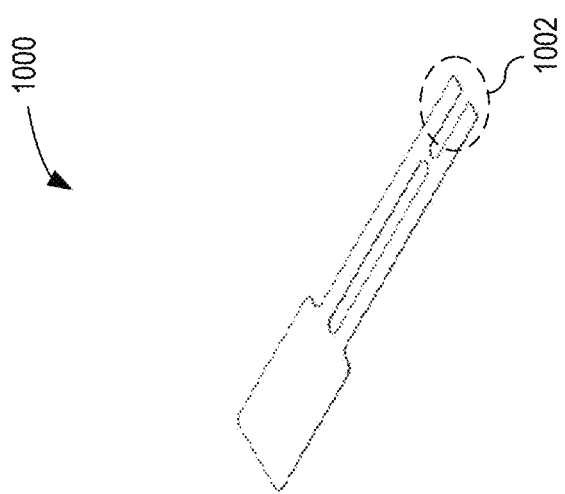
FIG. 10 is a perspective view of an example of an implementation of a pickup-tab in accordance with the present disclosure.
Figure 12:
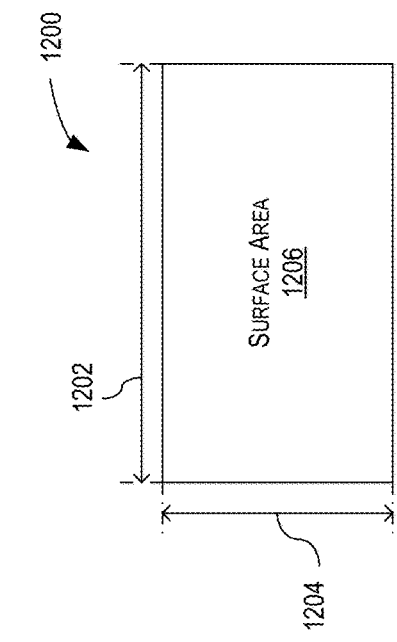
FIG. 12 is a top view of an example of an implementation of another PV solar cell having a rectangular polygon perimeter in accordance with the present disclosure.
Figure 13:
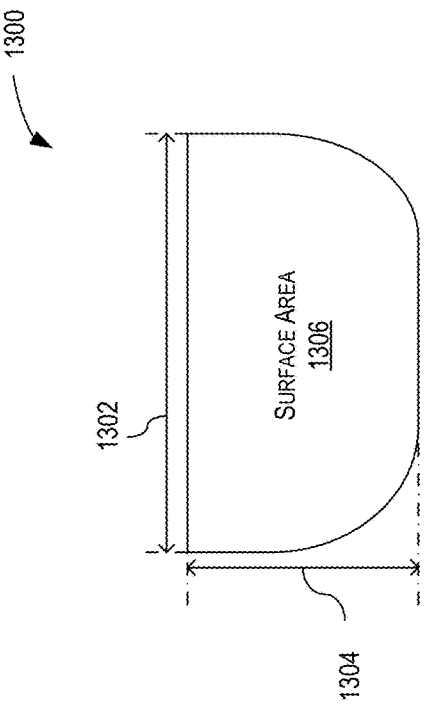
FIG. 13 is a top view of an example of an implementation of another PV solar cell having a D-shaped polygon perimeter with curved sides in accordance with the present disclosure.
Figure 11:
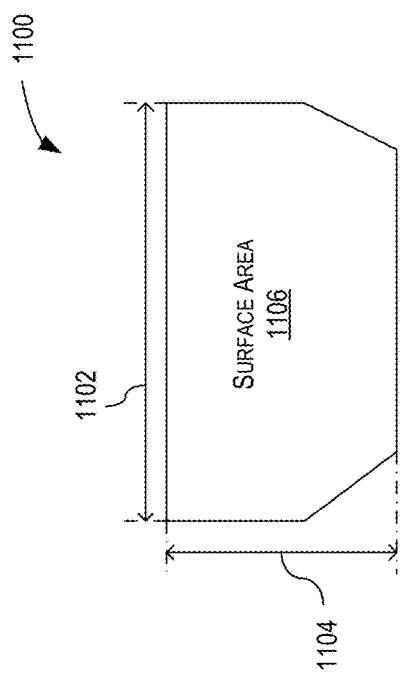
FIG. 11 is a top view of an example of another implementation of the RSPM using non-D shaped PV solar cells in accordance with the present disclosure.
Figure 14:
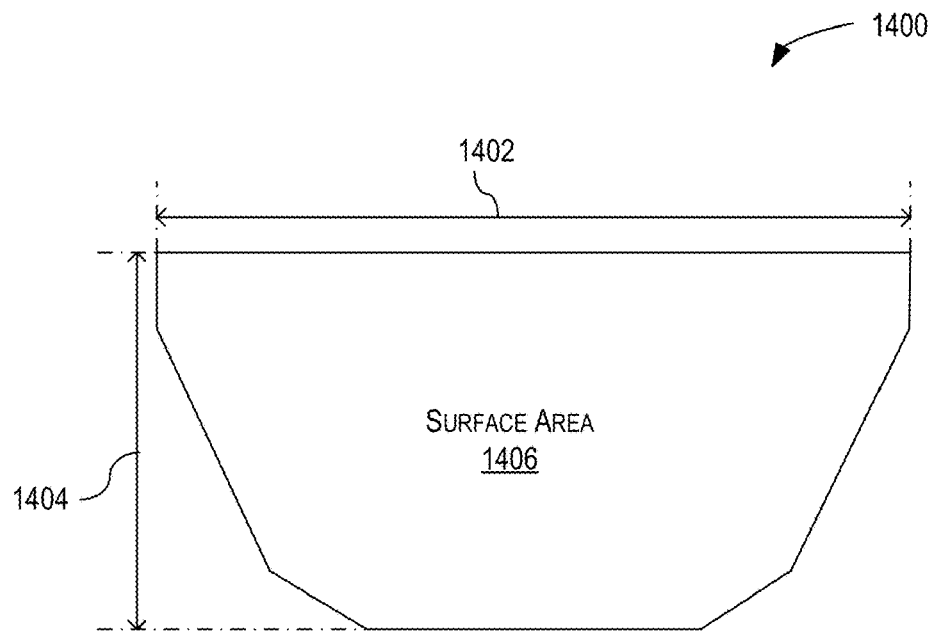
FIG. 14 is a top view of an example of an implementation of another PV solar cell having a D-shaped polygon perimeter with eight sides in accordance with the present disclosure.
Figure 15:
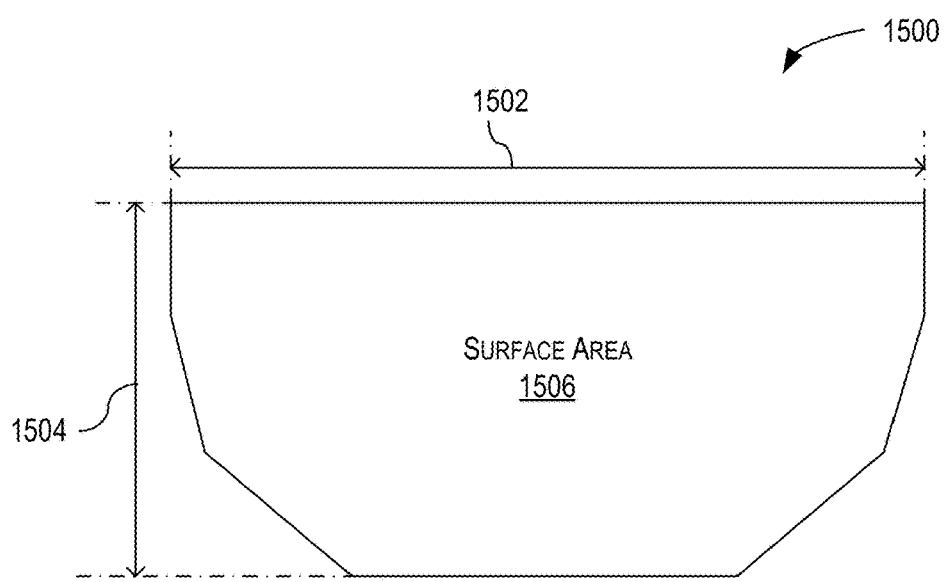
FIG. 15 is a top view of an example of an implementation of yet another PV solar cell having a D-shaped polygon perimeter with eight sides in accordance with the present disclosure.
Figure 16:
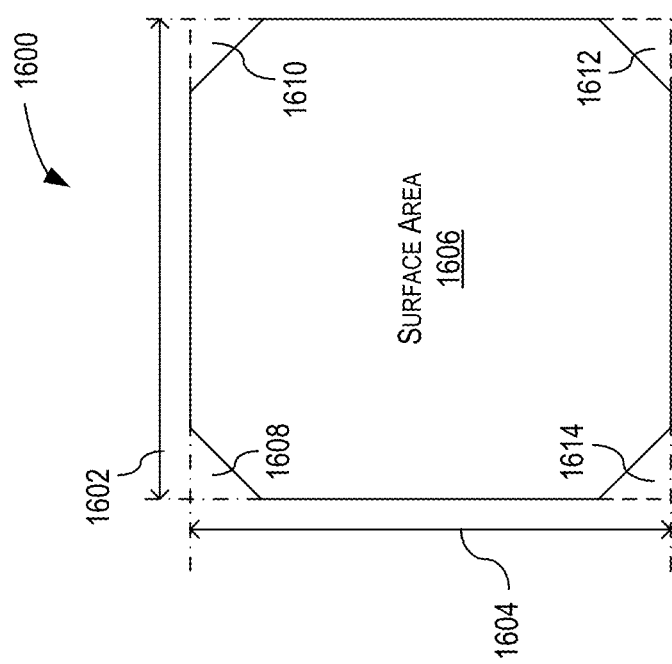
FIG. 16 is a top view of an example of an implementation of another PV solar cell having an octagonal shaped polygon perimeter with eight sides in accordance with the disclosure.

FIG. 10 is a perspective view of an example of an implementation of a pickup-tab 1000 in accordance with the present disclosure. In general, the pickup-tab 1000 is a flat piece of metal having toes 1002. Turning to FIGS. 11 through 16, a number of possible PV solar cells are shown, in accordance with the present disclosure, having different convex polygons shapes. In FIG. 11, a PV solar cell 1100 is shown (in accordance with the disclosure) having a six-sided polygon with a width 1102 of approximately 12.71 cm, a length 1104 of approximately 6.25 cm, and a resulting surface area 1106 of approximately 73 cm². In FIG. 12, a PV solar cell 1200 is shown (in accordance with the disclosure) having a rectangular polygon with a width 1202 of approximately 6.91 cm, a length 1204 of approximately 3.97 cm, and a resulting surface area 1206 of approximately 27 cm². In FIG. 13, a PV solar cell 1300 is shown (in accordance with the disclosure) having a D-shaped polygon (with two curved sides) with a width 1302 of approximately 13.89 cm, a length 1304 of approximately 6.96 cm, and a resulting surface area 1306 of approximately 80 cm². In FIG. 14, a PV solar cell 1400 is shown (in accordance with the disclosure) having another D-shaped polygon (having eight sides) with a width 1402 of approximately 5.428 cm, a length 1404 of approximately 2.596 cm, and a resulting surface area 1406 of approximately 76.88 cm². As discussed earlier, the PV solar cell 1400 may be the shape utilized in previous examples to optimize the use of top surface of the flexible substrate and minimize any dead zones. Similarly, in FIG. 15, a PV solar cell 1500 is shown (in accordance with the disclosure) having yet another D-shaped polygon (having eight sides) with a width 1502 of approximately 5.428 cm, a length 1504 of approximately 2.596 cm, and a resulting surface area 1506 of approximately 78.89 cm². The difference in surface area between the PV solar cell 1400 and PV solar cell 1500 is based on the geometric positions of sides in the D-shaped polygon. As discussed earlier, the PV solar cell 1500 may be the shape utilized in previous examples to optimize the use of top surface of the flexible substrate and minimize any dead zones.

In general, the example polygon shapes of the different PV solar cells shown in FIGS. 11-15 are convex polygons that have approximately a 2 to 1 ratio between the width and the length. This ratio helps in allowing the RSPM to be flexed and rolled up. However, other PV solar cells having different polygon shapes may also be utilized in the RSPM. For example, in FIG. 16, a top view of an example of an implementation of another PV solar cell 1600 having an octagonal shaped polygon perimeter with eight sides is shown in accordance with the disclosure. In this example, the PV solar cell 1600 is a convex polygon that has approximately a 1 to 1 ratio between the width 1602 and length 1604. The values of the width 1602 and length 1604 are predetermine by the design of the RSPM to best optimize the use of top surface of the flexible substrate and minimize any dead zones. The resulting surface area 1606 of the PV solar cell 1600 is approximately equal to the multiplication of the width 1602 and length 1604 minus the cut-out areas 1608, 1610, 1612, and 1614.

Figure 17:
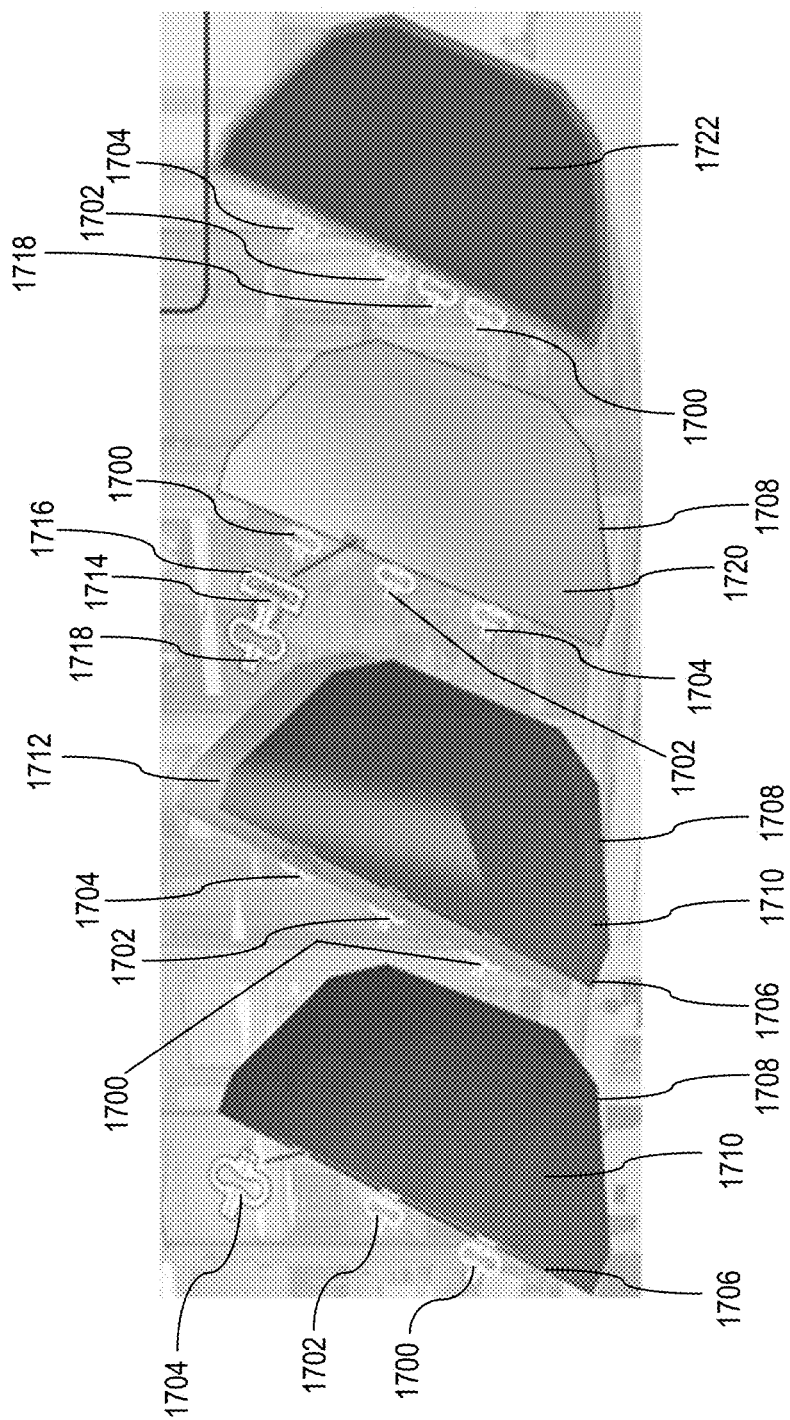
FIG. 17 is a process diagram of an example of an implementation of fabricating a PV solar cell in accordance with the present disclosure.

Turning to FIG. 17, a process diagram is shown of an example of an implementation of fabricating a PV solar cell in accordance with the present disclosure. The process begins by first attaching a plurality of in-plane interconnects 1700, 1702, and 1704 to an edge 1706 of a PV solar cell substrate 1708 having a top surface 1710. A coverglass 1712 is then attached to a top surface 1710 of the PV solar cell substrate 1708. The PV solar cell substrate 1708 is then turned around and a backside bypass diode 1714, bypass diode assembly 1716, and in-plane interconnect 1718 are attached to the backside 1720 of the PV solar cell substrate 1708 to produce the finished PV solar cell 1722.

Figure 18:
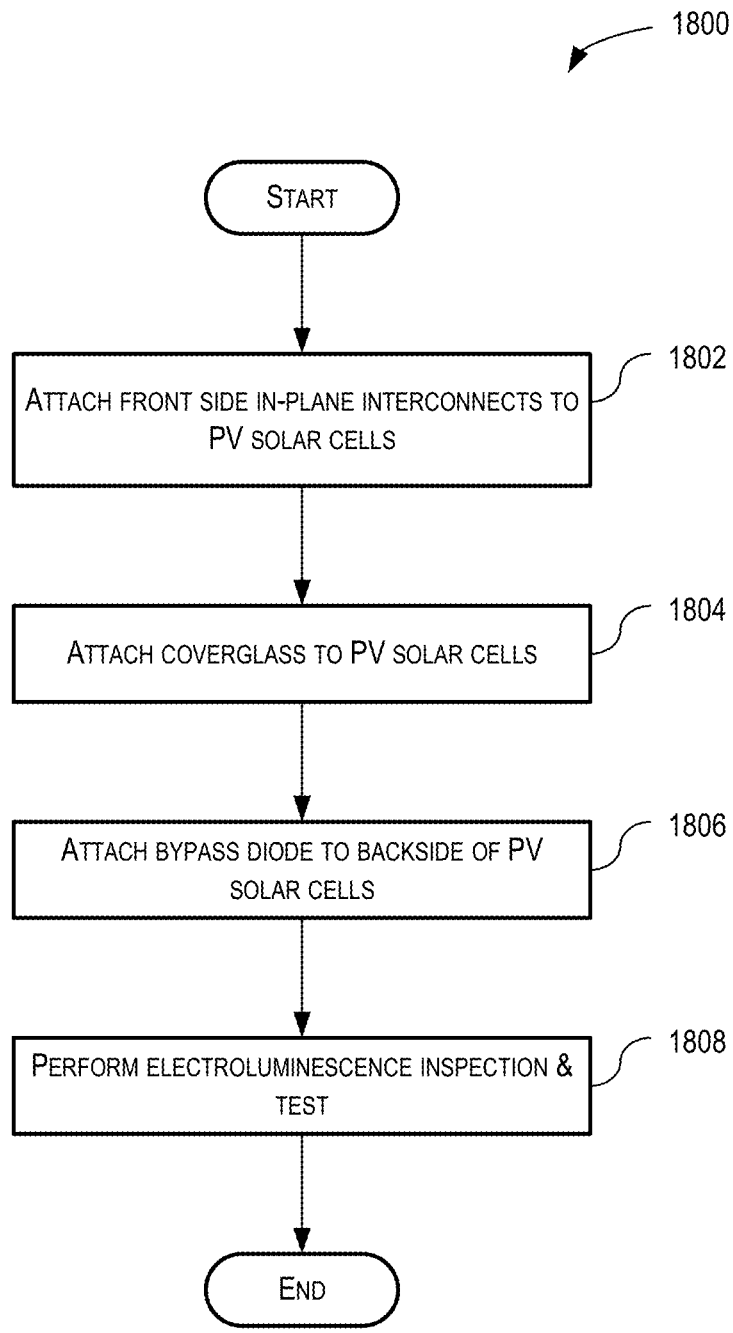
FIG. 18 is a flowchart of an example of an implementation of a method to fabricate the PV solar cell (shown in FIG. 17) in accordance with the present disclosure.

In FIG. 18, a flowchart of an example of an implementation of a method 1800 to fabricate the PV solar cell 1722 is shown in accordance with the disclosure. The method 1800 starts, in step 1802, by attaching the front-side in-plane interconnects 1700, 1702, and 1704 to an edge 1706 of the PV solar cell substrate 1708. In step 1804, the coverglass 1712 is attached to the top surface 1710 of the PV solar cell substrate 1708. In step 1806, the PV solar cell substrate 1708 is turned around and the backside bypass diode 1714, bypass diode assembly 1716, and in-plane interconnect 1718 are attached to the backside 1720 of the PV solar cell substrate 1708 to produce the finished PV solar cell 1722. In step 1808, an electroluminescence inspection and test is performed to confirm that the PV solar cell 1722 functions properly and the method 1800 ends.

Figure 19A:
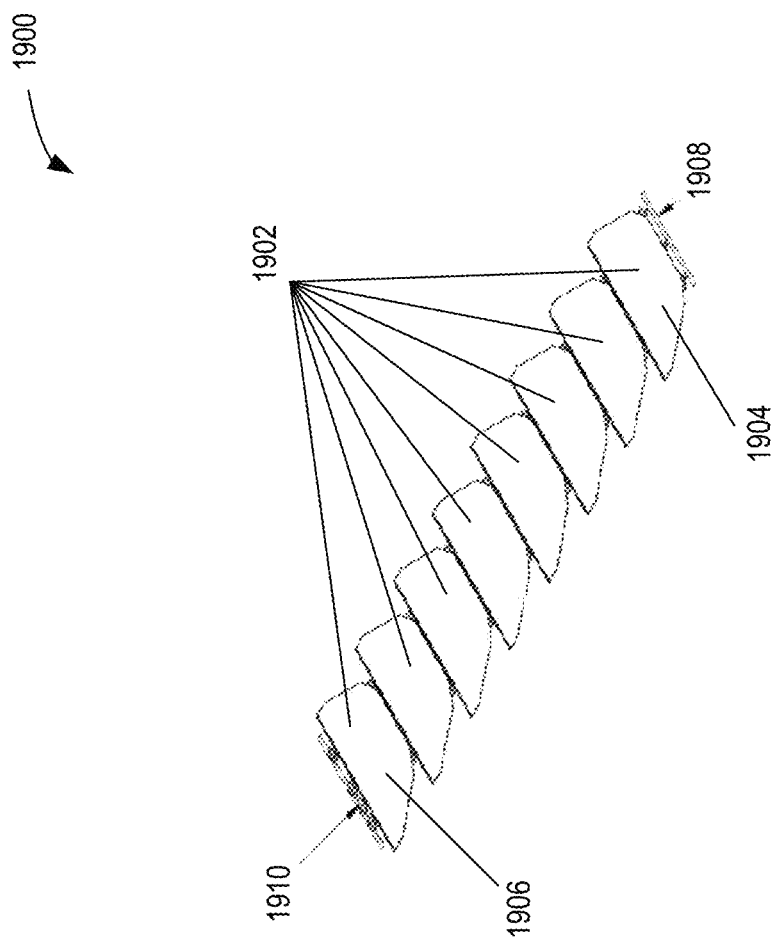
FIG. 19A is a perspective view of an example of an implementation of an adjacent string of a plurality of PV solar cells in accordance with the present disclosure.

Once the PV solar cells 1722 are fabricated, adjacent strings of the PV solar cells (such as PV solar cell 1722) may be fabricated and bonded on the flexible substrate to produce the RSPM as shown in FIGS. 19A through 23. Specifically, FIG. 19A is a perspective view of an example of an implementation of an adjacent string 1900 of a plurality of PV solar cells 1902. The perspective view is of the top of the PV solar cells 1902. In this example, eight PV solar cells 1902 are shown but it is appreciated that any plurality of PV solar cells 1902 may be utilized base on the design of the RSPM. The first PV solar cell 1904 and eighth PV solar cell 1906 are attached to the first end-tab 1908 and second end-tab 1910, respectively. The attachment is achieved by welding a first plurality of in-plane interconnects to both the first end-tab 1908 and first PV solar cell 1904 as described earlier. The eighth PV solar cell 1906 is welded to the second end-tab 1910. Furthermore, the remaining PV solar cells (in the plurality of PV solar cells 1902) are attached to each other and the first PV solar cell 1904 and eighth PV solar cell 1906 by welding a plurality of in-plane interconnects between the individual PV solar cells as described earlier. The welding process may be accomplished by use of an automated welding machine. In FIG. 19B, a perspective view of the backside of the adjacent string 1900 of the plurality of PV solar cells 1902 is shown. In this example, the plurality of in-plane interconnects are shown physically and electrically connecting the PV solar cells 1902 to each other and the first end-tab 1908 and second end-tab 1910. Furthermore, also shown are a plurality of bypass diodes 1912 and diode assemblies attached (e.g., welded) to the backsides of the PV solar cells 1902.

Figure 20A:
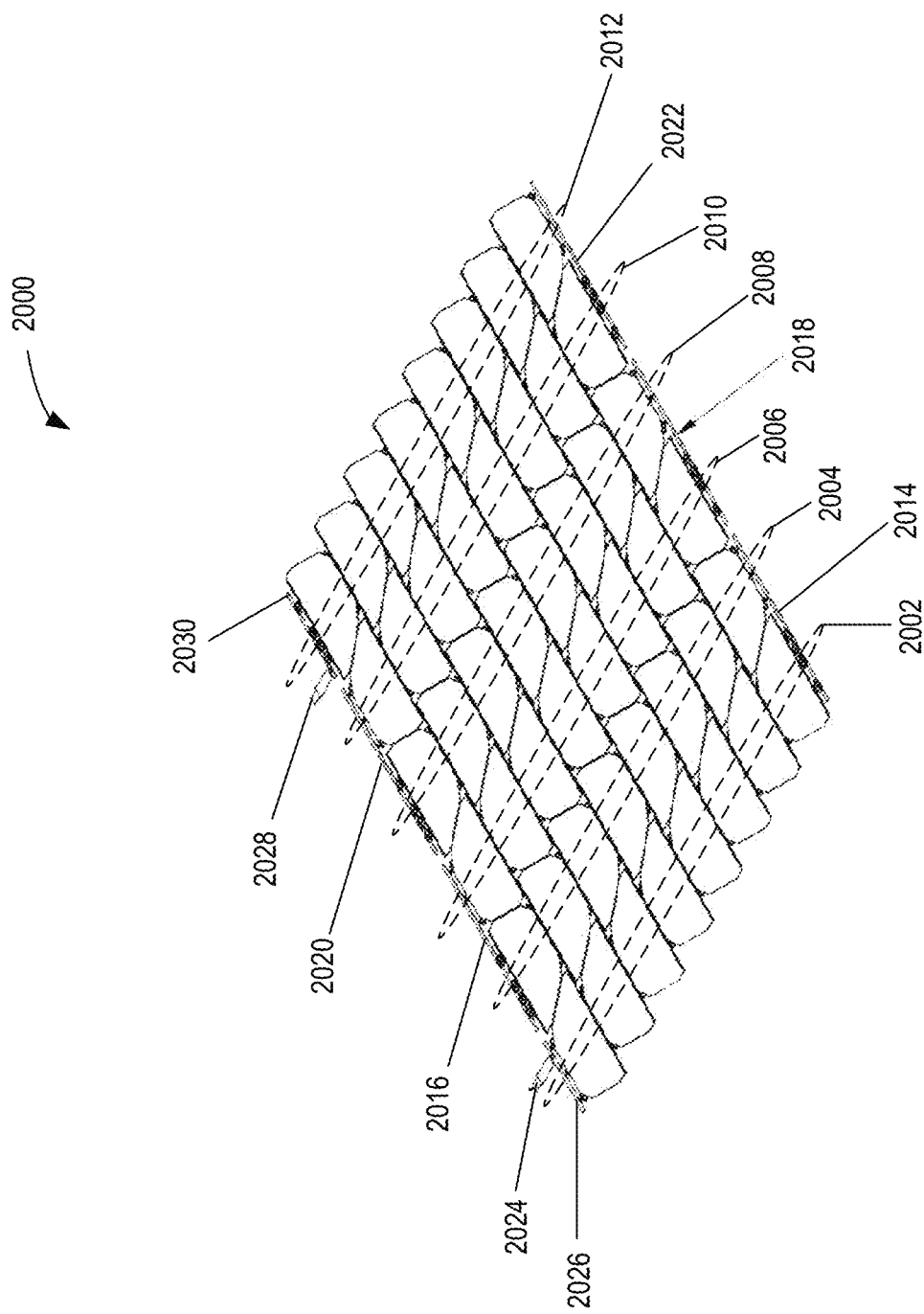
FIG. 20A is a perspective view of an example of an implementation of a PV solar panel assembly in accordance with the present description.

In FIG. 20A, a perspective view of an example of an implementation of a PV solar panel assembly 2000 is shown in accordance with the present description. The PV solar panel assembly 2000 includes a plurality of adjacent strings 2002, 2004, 2006, 2008, 2010, and 2012 and a plurality of end-tab jumpers 2014, 2016, 2018, 2020, and 2022. The PV solar panel assembly 2000 also includes a first pickup-tab 2024 attached (e.g., welded) to a first end-tab 2026 and a second pickup-tab 2028 attached (e.g., welded) to a last end-tab 2030.

Figure 20B:
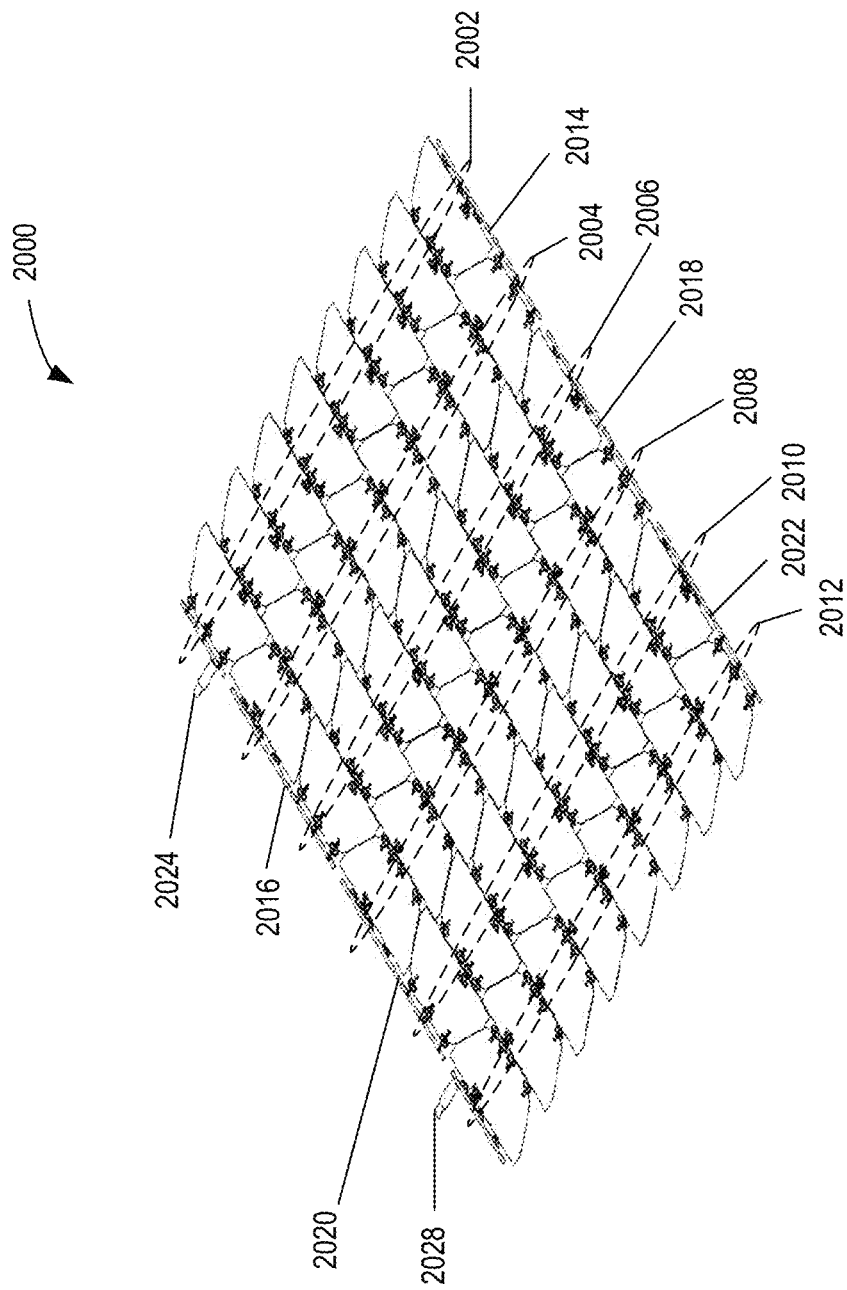
FIG. 20B is a perspective view of the backside of the PV solar panel assembly in accordance with the present disclosure.

FIG. 20B is a perspective view of the backside of the PV solar panel assembly 2000 in accordance with the present disclosure. In this view the plurality of in-plane interconnects are shown attached to the PV solar cells and end-tabs. The backside of the PV solar cells show the in-plane interconnects, bypass diode, and bypass diode assemblies. This completed PV solar panel assembly 2000 will be bonded onto the flexible substrate.

Figure 22:
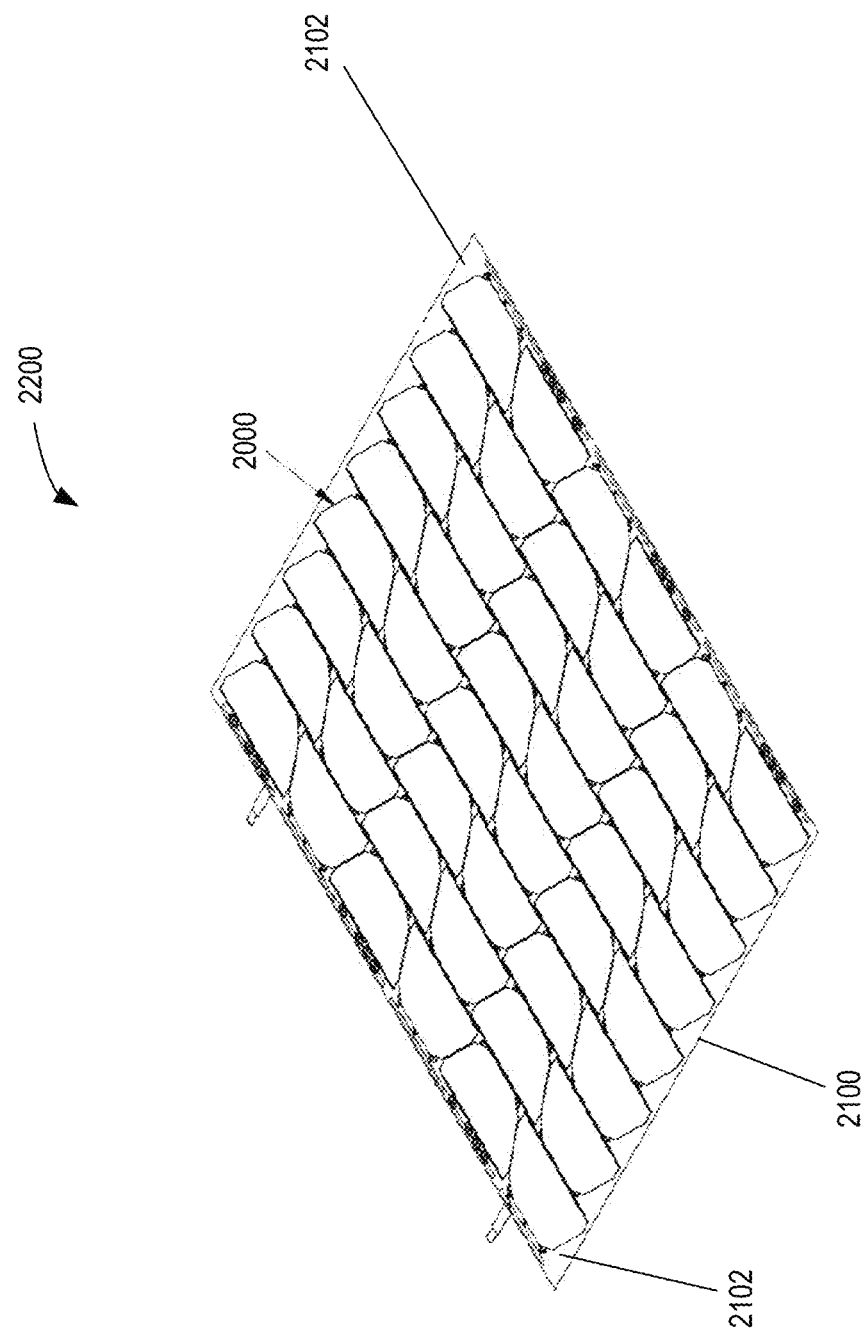
FIG. 22 is a perspective view of the RSPM formed from the PV solar panel assembly and the flexible substrate shown in FIGS. 19A-21 in accordance with the present disclosure.

In FIG. 21, an example of an implementation of a flexible substrate 2100 is shown in accordance with the present disclosure. As discussed earlier, the flexible substrate 2100 may be polyimide such as, for example, KAPTON®. The flexible substrate 2100 has a top surface 2102 that is configured to receive and be bonded to the PV solar panel assembly 2000. In FIG. 22, the PV solar panel assembly is laid out on and bonded to the top surface 2102 of the flexible substrate 2100 to produce the RSPM 2200.

Figure 23:
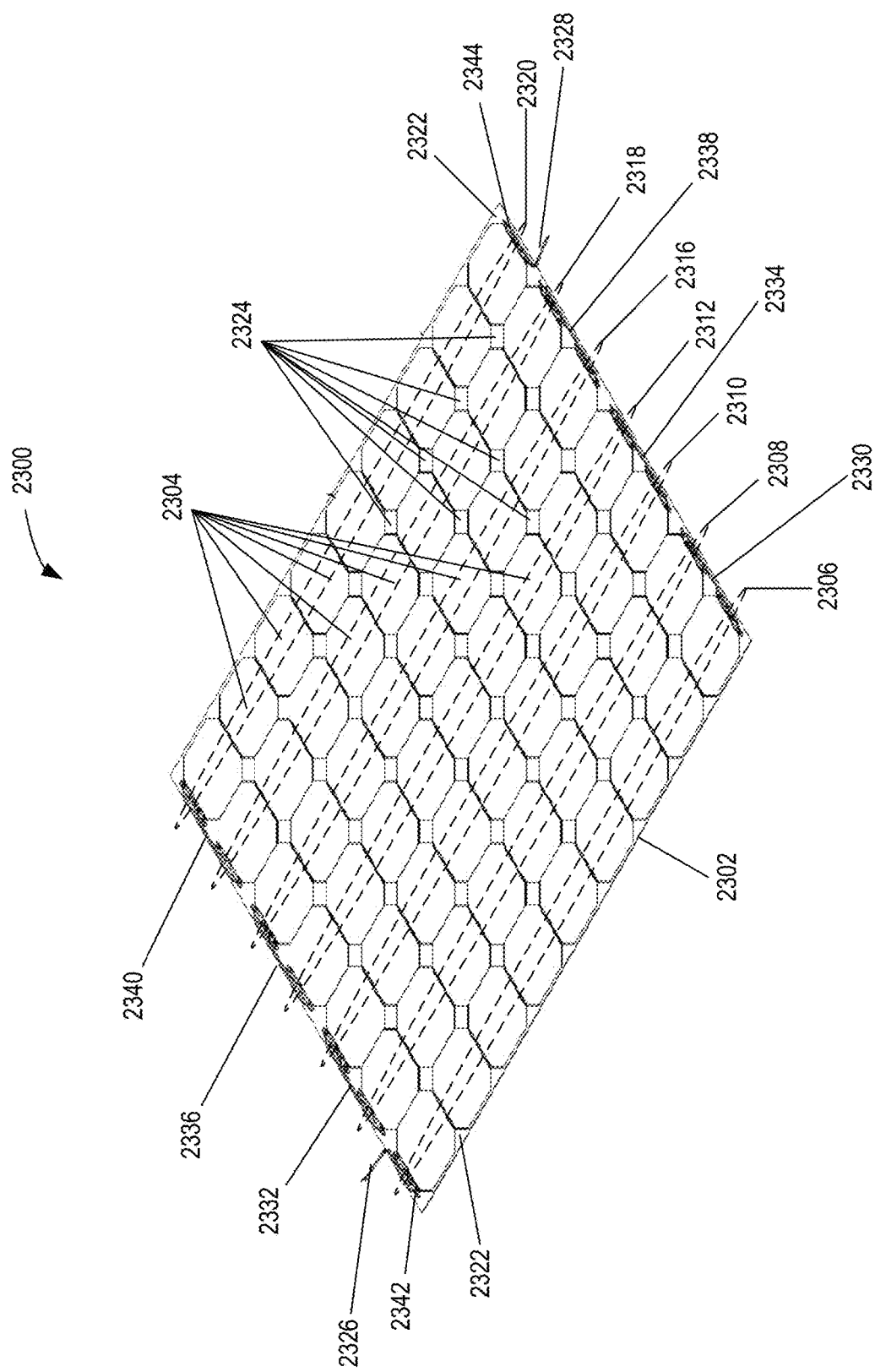
FIG. 23 is a perspective view of an example of another implementation of a RSPM formed from a PV solar panel assembly of PV solar cells (shown in FIG. 16) and a flexible substrate in accordance with the present disclosure.

FIG. 23 is a perspective view of an example of another implementation of a RSPM 2300 formed from a PV solar panel assembly of PV solar cells (shown in FIG. 16) and a flexible substrate 2302 in accordance with the present disclosure. In this example, instead of D-shaped PV solar cells, hexagonal PV solar cells 2304 (such as, for example, the PV solar cell 1600 shown in FIG. 16) are utilized. In this example, seven adjacent strings 2306, 2308, 2310, 2312, 2316, 2318, and 2320 of the PV solar cells 2304 are fabricated, laid down on, and bonded to a top surface 2322 of the flexible substrate 2302. This results in a plurality of dead zones 2324 on the top surface 2322 of the flexible substrate 2302. The same procedures described for FIGS. 19A-22 are utilized to produce the RSPM 2300. The RSPM 2300 also includes a first and second pickup tab 2326 and 2328. Depending on the size of the individual hexagonal PV solar cells 2304 the same type of end-tab and end-tab jumper types may be utilized as previously described. If, however, the size of the individual hexagonal PV solar cells 2304 are too large to properly utilizes the flat strips for end-tab jumpers, end-tab jumpers 2330, 2332, 2334, 2336, 2338, and 2340 that are stiff cylindrical wires may be utilized instead, where the cylindrical wires are designed to be attached to the end-tabs and have in-plane bends that do not extend outward from a plane parallel to the top surface 2322. Moreover, in this example, the first pickup-tab 2326 and second pickup-tab 2328 are also bent stiff cylindrical wires that a physically and electrically connected to a first end-tab 2342 and a last end-tab 2344, respectively.

Figure 19B:
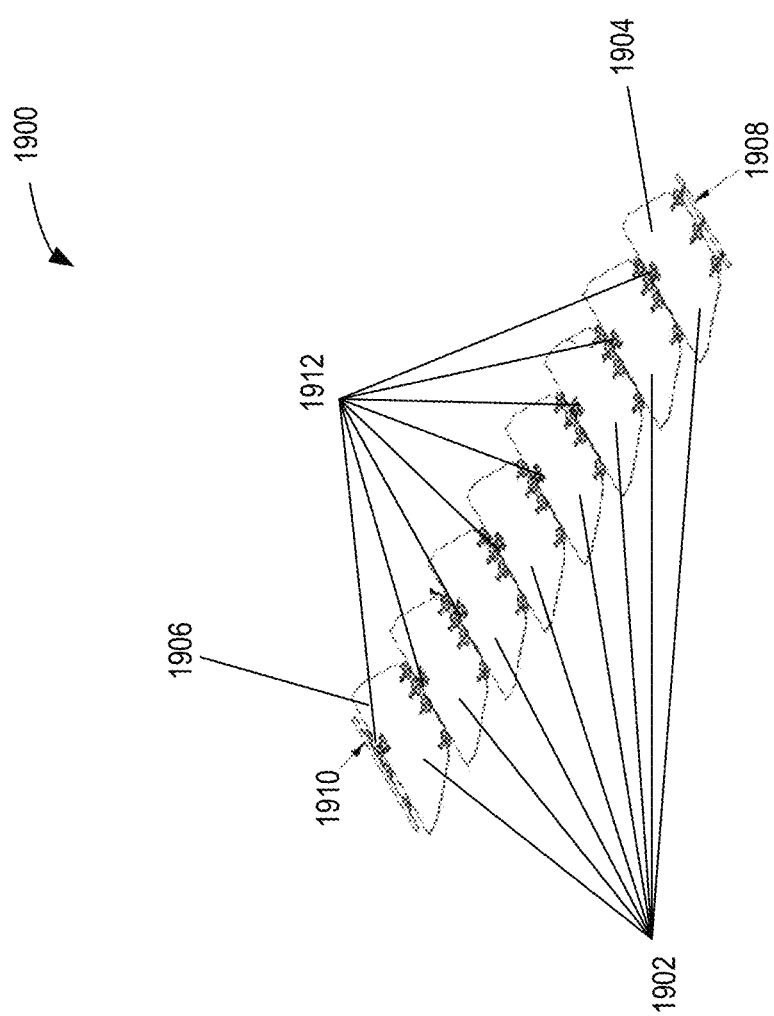
FIG. 19B is a perspective view of the backside of the adjacent string of the plurality of PV solar cells in accordance with present disclosure.
Figure 24:
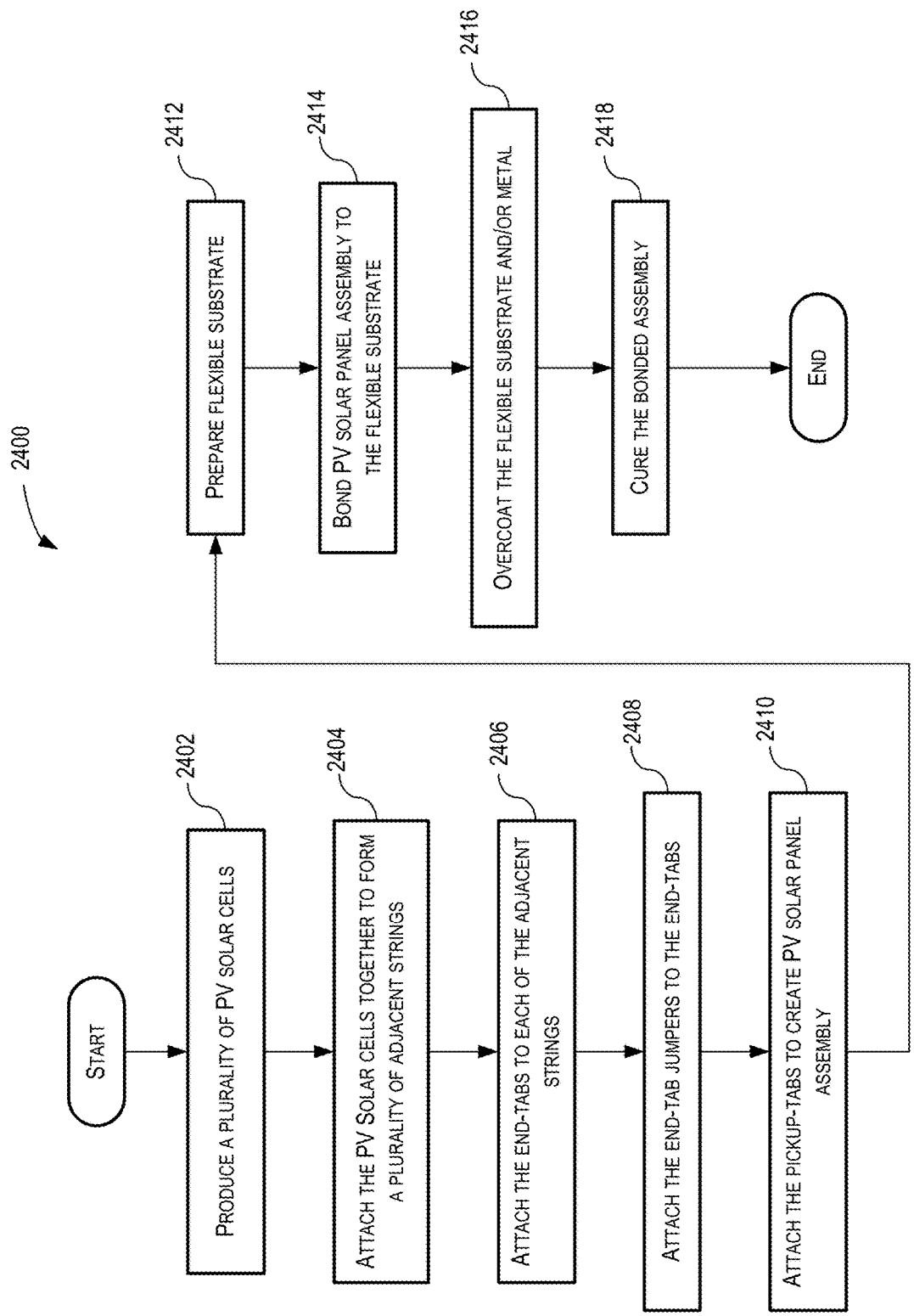
FIG. 24 is a flowchart of an example of an implementation of a method to fabricate the RSPM in accordance with the present disclosure.

Turning to FIG. 24, a flowchart of an example of an implementation of a method 2400 to fabricate the RSPM 2200 is shown in accordance with the present disclosure. The method 2400 begins by producing, in step 2402, a plurality of PV solar cells as described earlier in relation to FIGS. 17 and 18. The PV solar cells are then attached, in step 2404, together to form a plurality of adjacent strings as shown in FIGS. 19A and 19B. As discussed earlier, the attaching means may include welding in-plane interconnects to edge of a first PV solar cell and to the backside of an adjacent PV solar cell. The attached PV solar cells are then attached, in step 2406, (e.g., welded) to the end-tabs to form the complete adjacent strings. It is appreciated that the order of steps 2404 and 2406 may be optionally reversed or even performed at the same time. The end-tab jumpers are attached, in step 2408, (e.g., welded) to the end-tabs and the pickup-tabs are attached, in step 2410, (e.g., welded) to the end-tabs to create the PV solar panel assembly 2000. The attachment means may be welding via an automated welding machine. The flexible substrate 2100 is then prepared, in step 2412, and the PV solar panel assembly 2000 is bonded, in step 2414, (e.g., with adhesive) to the flexible substrate 2100. Any exposed metal and flexible substrate may then be overcoated, in step 2416, with an adhesive material for protection. The PV solar panel assembly 2000 is then cured, in step 2418, and the method 2400 ends.

In this disclosure, the RSPM may also include, or be in electrical connection with, a blocking diode to help protect the RSPM. In general, a blocking diode allows the flow of current from the RSPM to a battery (or other power system) to charge and/or provide power the battery or other electrical devices on the spacecraft. It also "blocks" (i.e., prevents) the flow of a reverse current from the battery or other power systems to the RSPM thereby preventing the battery or other power systems from discharging or producing a negative current that is injected into the RSPM reducing its power generation.

Figure 25:
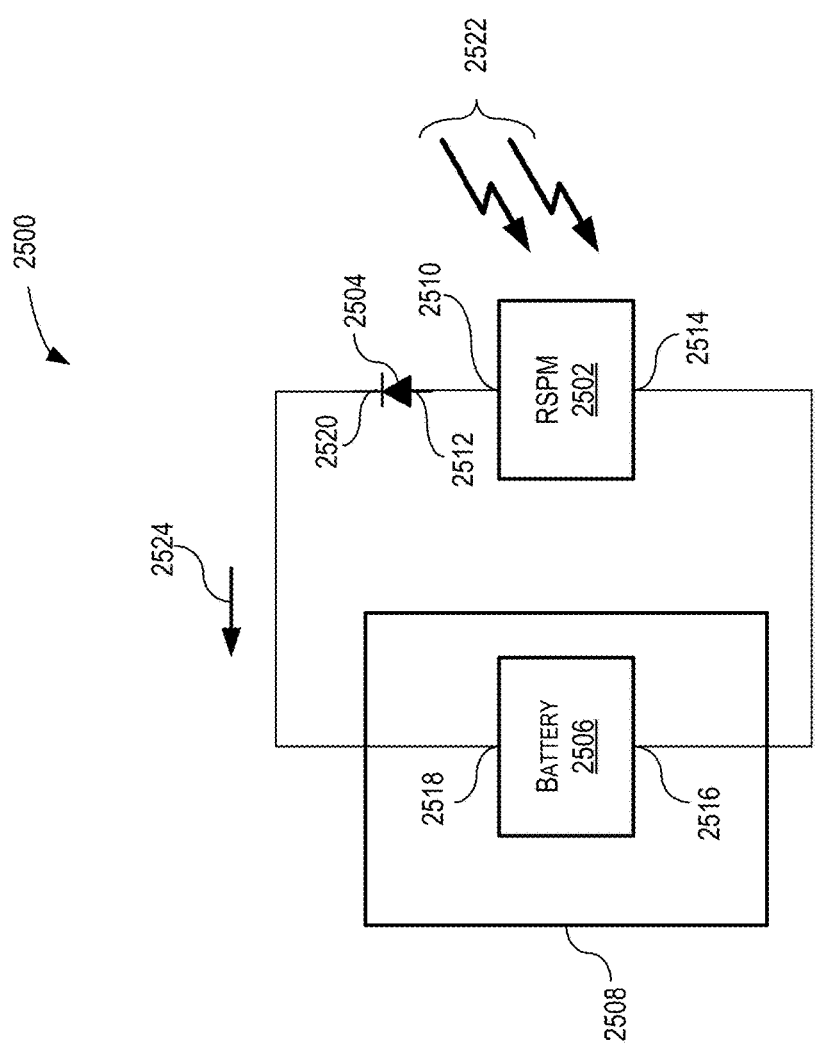
FIG. 25 is a block diagram of an example of an implementation of a blocking circuit in accordance with the present disclosure.

Turning to FIG. 25, a block diagram of an example of an implementation of a blocking circuit 2500 is shown in accordance with the present disclosure. The blocking circuit 2500 includes a RSPM 2502, blocking diode 2504, and a battery 2506 (or other power system) on the spacecraft 2508 (which may be a satellite, space station, spaceship, etc.). The RSPM 2502 has a positive polarity terminal 2510 electrically connected to the anode 2512 of the blocking diode 2504 and a negative polarity terminal 2514 electrically connected to a negative polarity terminal 2516 of the battery 2506. A positive polarity terminal 2518 of the battery 2506 is electrically connected to cathode 2520 of the blocking diode 2504.

In normal operation, when the RSPM 2502 receives Sunlight 2522, the RSPM 2502 is at a high potential and produces electricity that results in a current 2524 that is passed through the blocking diode 2504 to the battery 2506 (or other power system) so as to charge the battery 2506 or power the other power systems. However, when the RSPM 2502 does not receive Sunlight 2522 (or a small amount of Sunlight 2522) because it is a shaded or off angle position from the Sunlight 2522, the RSPM 2502 is at lower potential than the battery 2506. Normally, this would result in the battery 2506 discharging as it would be at a higher potential than the RSPM 2502 and would resulting drive a reverse current into the RSPM 2502. The blocking diode 2504 prevents this situation by blocking the reverse current from flowing into the RSPM 2502.

Figure 26:
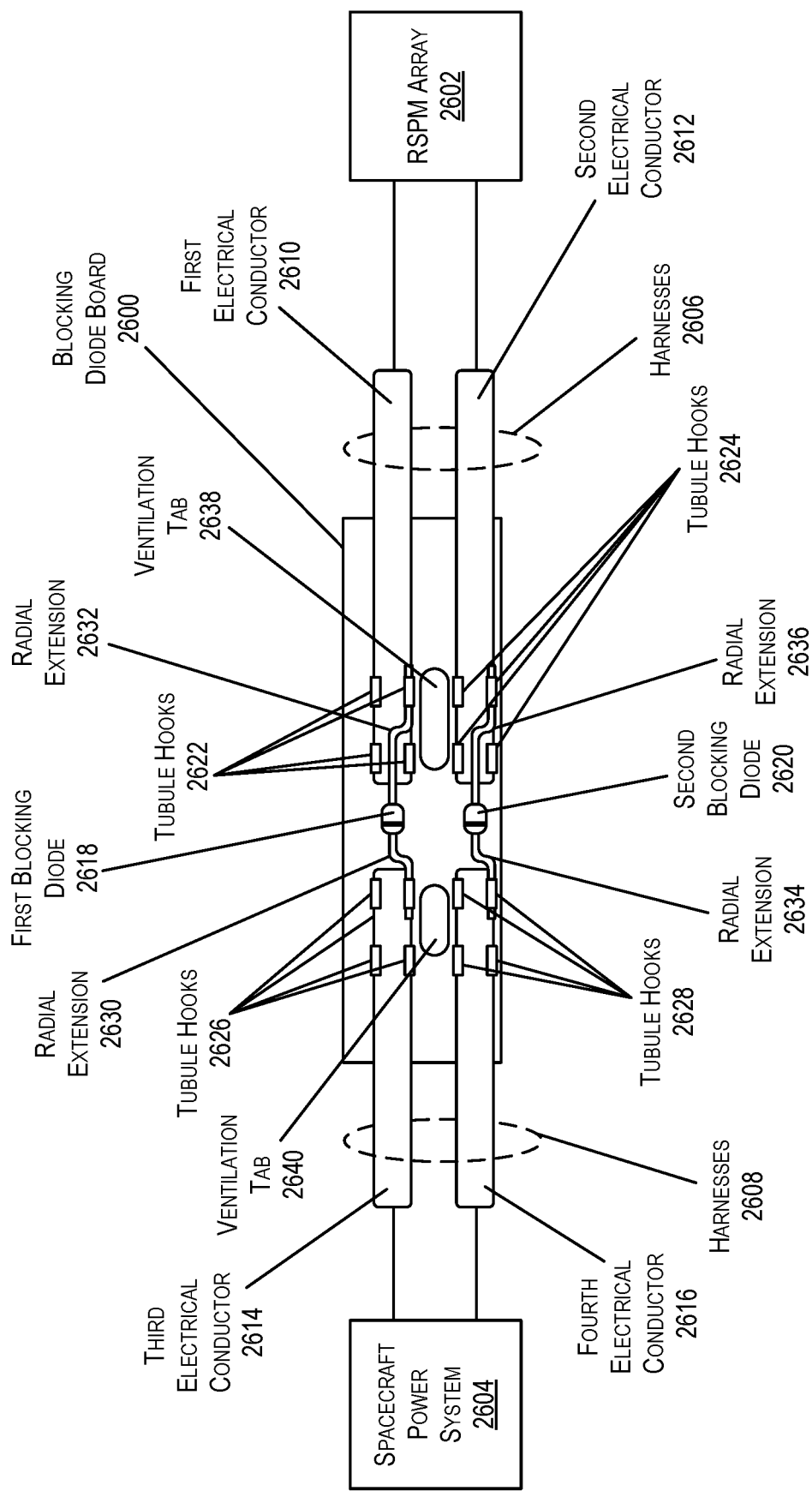
FIG. 26 is a system block diagram of an example of an implementation of a blocking diode board in accordance with the present disclosure.

In general, in spacecraft, the blocking diode 2504 is part of a blocking diode board that is electrically connected to the solar panels. Turning to FIG. 26, a system block diagram of an example of an implementation of a blocking diode board ("BDB") 2600 is shown in accordance with the present disclosure. In this example, the BDB 2600 is shown electrically connected to both an RSPM array 2602 and a spacecraft power system 2604 via a plurality of conductors or power harnesses 2606 from the RSPM array 2602 and another plurality of conductors or power harnesses 2608 to the spacecraft power system 2604. In this example, for ease of illustration, it is assumed that the RSPM 2602 only has two RSPM, where each RSPM is implemented as previously discussed. As such, in this example, the plurality of conductors or power harnesses 2606 from the RSPM array 2602 includes a first electrical conductor 2610 and a second electrical conductor 2612. Similarly, the plurality of conductors or power harnesses 2608 to the spacecraft power system 2604 includes a third electrical conductor 2614 and a fourth electrical conductor 2616. In this example, a first blocking diode 2618 is electrically connected to the first electrical conductor 2610 and the third electrical conductor 2614. Similarly, a second blocking diode 2620 is electrically connected to the second electrical conductor 2612 and the fourth electrical conductor 2616. The first electrical conductor 2610 includes a first plurality of tubule hooks 2622 and the second electrical conductor 2612 includes a second plurality of tubule hooks 2624. The third electrical conductor 2614 includes a third plurality of tubule hooks 2626 and the fourth electrical conductor 2616 includes a second plurality of tubule hooks 2628. The first blocking diode 2618 includes a first radial extension 2630 and a second radial extension 2632 and the second blocking diode 2620 includes a first radial extension 2634 and a second radial extension 2636. The BDB 2600 also includes a first ventilation tab 2638 and second ventilation tab 2640.

In this example, the first, second, third, and fourth electrical conductors 2610, 2612, 2614, and 2616 are flat conductors that may be metallic strips. The first and second blocking diodes 2618 and 2620 may be standard diodes that are capable of operating at the design conditions of the system. The blocking diodes 2618 and 2620 may be voidless hermetically sealed fast recovery glass rectifiers. An example of a blocking diode 2618 and 2620 may be a JANTXV 1N5418 diode produced by Micosemi Corporation of Aliso Viejo, Calif.

In general, the BDB 2600 includes a flexible tab that integrates onto the spacecraft and includes features that enable a transition from a wired conductor to flat tab connection and also is capable of integrating the first and second blocking diodes 2618 and 2620 onto a flat connection. The BDB 2600 allows flexible tabs that include tubular connections (also known as tubular hooks) to integrate with the blocking diodes 2618 and 2620. This allows integration of the wiring of a spacecraft onto a flexible structure while integrating the blocking diodes 2618 and 2620 onto the flexible structure.

In this approach, the harnesses (such as harness 2608) of a spacecraft has the tubule hooks (e.g., tubule hooks 2626 and 2628) to integrate the blocking diodes 2618 and 2620 into the BDB 2600. Each one of the blocking diodes 2618 and 2620 have flexible and shaped connections (e.g., radial extensions 2630 and 2632 and 2634 and 2636, respectively). The harnesses 2608 provides a wiring interface via the tubule hooks 2626 and 2634 for the spacecraft interface (not shown) to the spacecraft power system 2604. In other words, the BDB 2600 is a flexible blocking diode board that includes a radial extension integrated with a set of conductors where the conductors have monolithic connections extending out of the conductors and are substantially flat and supported on the BDB 2600. The BDB 2600 also include a plurality of ventilation tabs (i.e., holes) 2638 and 2640 for adhesive ventilation.

This approach allows the integration of three-dimensional blocking diodes 2618 and 2620 onto relatively flat connections that support flexibility and rollability in roll out solar array panels. As such, in general, the DBD 2600 includes a set of blocking diodes 2618 and 2620 disposed on the DBD 2600 where each blocking diode 2618 and 2620 connects to the set of flat conductors (e.g., 2610, 2612, 2614, and 2616). The blocking diodes 2618 and 2620 are asymmetrically connected to the conductors (e.g., 2610, 2612, 2614, and 2616) via the radial extensions 2630, 2632, 2634, and 2636 such that the blocking diodes 2618 and 2620 are on a first plane parallel and relative to the conductors (e.g., 2610, 2612, 2614, and 2616) on a second plane.

In other words, the connection connecting the blocking diodes 2618 and 2620 and the conductors (e.g., 2610, 2612, 2614, and 2616) are Tubule hooks (e.g., 2626, 2628, 2622, 2624) monolithically extending from the conductor (e.g., 2610, 2612, 2614, and 2616) and the plurality of tubule hooks (e.g., 2626, 2628, 2622, 2624) are positioned on a first end of each of the conductors such that the tubule hooks (e.g., 2626, 2628, 2622, 2624) are longitudinally spaced and positioned on a first and second side of each of the conductors (e.g., 2610, 2612, 2614, and 2616). In this example, the plurality of conductors (e.g., 2610, 2612, 2614, and 2616) are asymmetrically positioned on the BDB 2600 and the board includes the set of ventilation tabs (2638 and 2640) for venting adhesives during cure.

In this example, the radial extensions 2630, 2632, 2634, and 2636 have curvature and radius features that are predetermined by the design of the RSPM to properly react to thermal loads in cycling and launch vibration. The curvature and radius may be formed with a forming tool to control the placement of the bends relative to the blocking diode 2618 or 2620 body.

Figure 27:
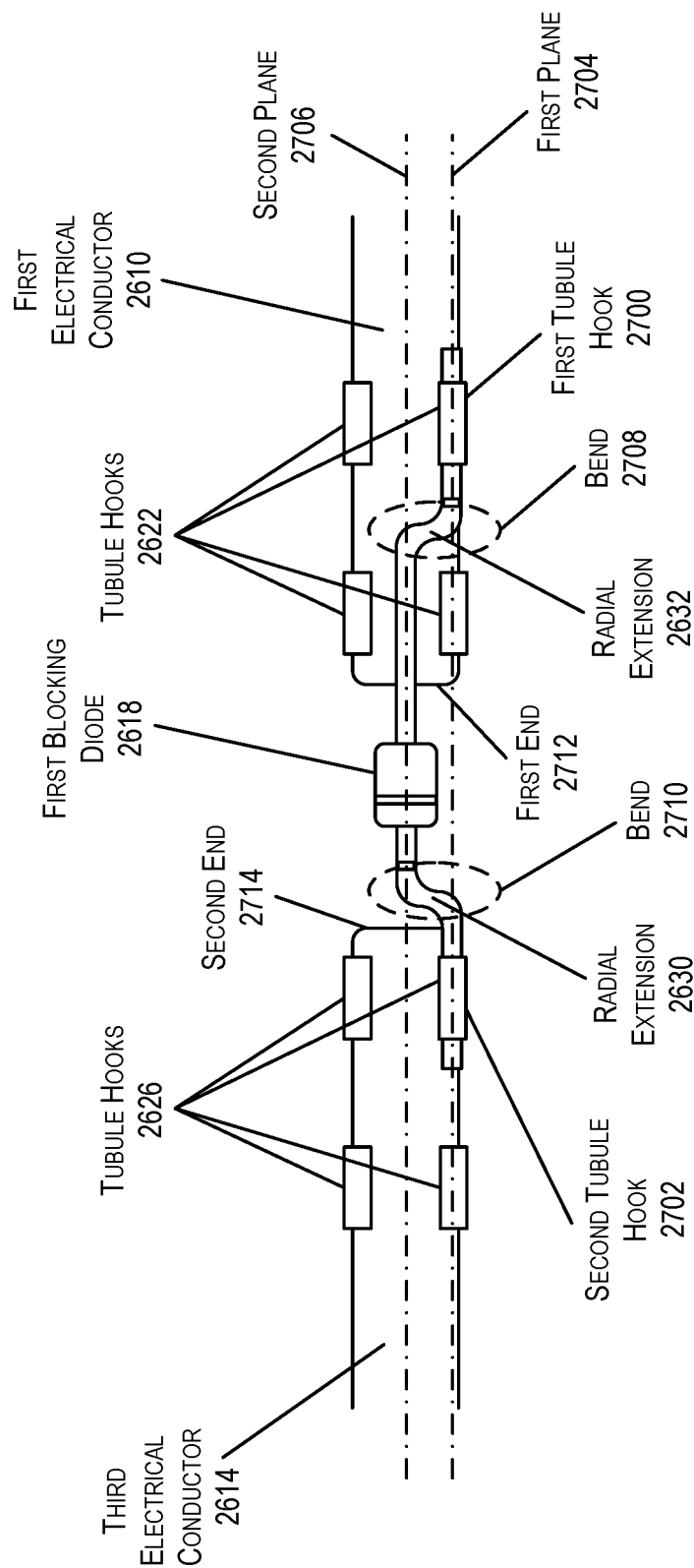
FIG. 27 is a zoomed in view of the system block diagram shown in FIG. 26 in accordance with the present disclosure.

Turning to FIG. 27, a zoomed in view of the system block diagram shown in FIG. 26 is shown in accordance with the present disclosure. In this example, the DBD 2600 includes the blocking diode 2618, first flat electrical conductor 2610, second flat electrical conductor 2614, first tubular hook 2700 (of the plurality of tubule hooks 2622), and second tubular hook 2702 of the plurality of tubule hooks 2626. The blocking diode 2618 includes the first radial extension 2632 that is a first wire and a second radial extension 2630 that is a second wire. The first tubular hook 2700 monolithically extends from the first flat electrical conductor 2610, where the first tubular hook 2700 is physically and electrically connected to the first radial extension 2632. Similarly, the second tubular hook 2702 monolithically extends from the second flat electrical conductor 2614, where the second tubular hook 2702 is physically and electrically connected to the second radial extension 2630. The first tubular hook 2700 and second tubular hook 2702 are located within a first plane 2704 and the blocking diode 2618 is located in a second plane 2706 and the first radial extension 2632 includes a first bend 2708 from the first plane 2704 to the second plane 2706 and the second radial extension 2630 includes a second bend 2710 from the first plane 2704 to the second plane 2706. It is appreciated that the configuration for the second blocking diode 2620 is similar.

It will be understood that various aspects or details of the invention may be changed without departing from the scope of the invention. It is not exhaustive and does not limit the claimed inventions to the precise form disclosed. Furthermore, the foregoing description is for the purpose of illustration only, and not for the purpose of limitation. Modifications and variations are possible in light of the above description or may be acquired from practicing the invention. The claims and their equivalents define the scope of the invention.

In some alternative examples of implementations, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different examples of implementations has been presented for purposes of illustration and description, and is not intended to be exhaustive or limited to the examples in the form disclosed. Many modifications and variations will be apparent to those of ordinary skill in the art. Further, different examples of implementations may provide different features as compared to other desirable examples. The example, or examples, selected are chosen and described in order to best explain the principles of the examples, the practical application, and to enable others of ordinary skill in the art to understand the disclosure for various examples with various modifications as are suited to the particular use contemplated.

What is claimed is:

1. A rollable blocking diode board for use with a rollable solar power module array, the rollable blocking diode board comprising:
   a flexible base, wherein flexibility of the flexible base is configured to support rollability of the rollable blocking diode board during roll out of the rollable solar power module array;
   a first flat electrical conductor coupled to the flexible base;
   a second flat electrical conductor coupled to the flexible base;
   a first connector monolithically extending from the first flat electrical conductor;
   a second connector monolithically extending from the second flat electrical conductor; and
   a blocking diode, the blocking diode comprising a first conductor and a second conductor that extend from a body of the blocking diode, wherein the first conductor is electrically coupled to the first connector of the first flat electrical conductor and comprises a first plurality of bends between the first connector and the body, and wherein the second conductor is electrically coupled to the second connector of the second flat electrical conductor and comprises a second plurality of bends between the second connector and the body.

2. The rollable blocking diode board of claim 1, further comprising a plurality of openings in the flexible base.

3. The rollable blocking diode board of claim 1, wherein the first flat electrical conductor has a first end and the second flat electrical conductor has a second end, wherein the first flat electrical conductor includes a third connector monolithically extending from the first flat electrical conductor, and wherein the second flat electrical conductor includes a fourth connector monolithically extending from the second flat electrical conductor.

4. The rollable blocking diode board of claim 1, wherein the first flat electrical conductor and the second flat electrical conductor are asymmetrically positioned on the flexible base relative to a mid-line between a first end and a second end of the flexible base.

5. The rollable blocking diode board of claim 1, wherein the blocking diode is a Voidless Hermetically Sealed Fast Recovery Glass Rectifier.

6. The rollable blocking diode board of claim 1, further including
   a third flat electrical conductor and a fourth flat electrical conductor coupled to the flexible base;
   a third connector monolithically extending from the third flat electrical conductor;
   a fourth connector monolithically extending from the fourth flat electrical conductor; and
   a second blocking diode, the second blocking diode comprising a third conductor and a fourth conductor that extend from a second body of the second blocking diode, wherein the third conductor is electrically coupled to the third connector, and wherein the fourth conductor is electrically coupled to the fourth connector.

7. The rollable blocking diode board of claim 6, wherein the third flat electrical conductor has a first end and the fourth flat electrical conductor has a second end, wherein the third conductor extends from the third flat electrical conductor at a first distance from the first end, wherein the fourth connector extends from the fourth flat electrical conductor at a second distance from the second end, and wherein the first distance is greater than the second distance.

8. The rollable blocking diode board of claim 6, wherein the third flat electrical conductor and the fourth flat electrical conductor are asymmetrically positioned on the flexible base relative to a mid-line between a first end and a second end of the flexible base.

9. The rollable blocking diode board of claim 6, wherein the blocking diode and second blocking diode are Voidless Hermetically Sealed Fast Recovery Glass Rectifiers.

10. The rollable blocking diode board of claim 1, further comprising the rollable solar power module array electrically coupled to the first flat electrical conductor, wherein the rollable solar power module array comprises:
   a flexible substrate, wherein the flexible substrate has a flexible substrate length and a top surface;
   a plurality of adjacent strings of a plurality of photovoltaic solar cells attached on the top surface of the flexible substrate,
      wherein each photovoltaic solar cell has a perimeter that is a convex polygon;
      wherein the plurality of adjacent strings is configured to be rollable along the flexible substrate length,
      wherein each adjacent string of the plurality of adjacent strings has an orientation along the flexible substrate length, and
      wherein each two adjacent strings, of a pair of adjacent strings, have corresponding orientations in opposite directions; and
   at least one end-tab jumper physically and electrically connected to the plurality of adjacent strings, wherein the at least one end-tab jumper electrically connects the plurality of adjacent strings to form a series circuit.

11. The rollable blocking diode board of claim 1, wherein the first flat electrical conductor comprises a metal strip.

12. The rollable blocking diode board of claim 10, wherein the blocking diode is configured to inhibit flow of electricity from a spacecraft power system to the rollable solar power module array.

13. The rollable blocking diode board of claim 1, further comprising a power system coupled to the second flat electrical conductor.

14. A rollable blocking diode board for use with a rollable solar power module array, the rollable blocking diode board comprising:
   a flexible base, wherein flexibility of the flexible base is configured to support rollability of the rollable blocking diode board during roll out of the rollable solar power module array;
   a plurality of first flat electrical conductors, each first flat conductor coupled to a first end of the flexible base, each first flat electrical conductor configured to be electrically coupled to the rollable solar power module array, and each of the plurality of the first flat electrical conductors comprising a first connector electrically coupled to and extending from a first surface of the first flat electrical conductor;
   a plurality of second flat electrical conductors, each second flat conductor coupled to a second end of the flexible base, each second flat electrical conductor configured to be electrically coupled to a power system that receives electricity from the rollable solar power module array, and each of the plurality of second flat electrical conductors comprising a second connector electrically coupled to and extending from a first surface of the second flat electrical conductor; and
   a plurality of blocking diodes, each blocking diode comprising a pair of wires that extend from a body of the blocking diode, wherein a first wire of the pair is electrically coupled to a particular first connector of a particular first flat electrical conductor of the plurality of first flat electrical conductors, and wherein a second wire of the pair is electrically coupled to a particular second connector of a particular second flat electrical conductor of the plurality of second flat electrical conductors, the plurality of blocking diodes arranged to inhibit flow of electricity from the power system to the rollable solar power module array.

15. The rollable blocking diode board of claim 14, further comprising a plurality of openings in the flexible base.

16. The rollable blocking diode board of claim 14, wherein the pair of wires of each blocking diode of the plurality of blocking diodes are flexible and shaped to couple to appropriate connectors.

17. The rollable blocking diode board of claim 14, wherein the pair of wires include one or more curvatures to compensate for thermal loads and vibrations.

18. The rollable blocking diode board of claim 14, wherein the plurality of first flat electrical conductors comprise metal strips.

19. The rollable blocking diode board of claim 14, wherein the plurality of blocking diodes comprise glass rectifiers.

20. A system comprising:
   a flexible base of a rollable blocking diode board, wherein flexibility of the flexible base is configured to support rollability of the rollable blocking diode board during roll out of a rollable solar power module array coupled to the rollable blocking diode board;
   a plurality of first flat electrical conductors, each first flat conductor coupled to a first end of the flexible base, and each of the plurality of the first flat electrical conductors comprising a first connector electrically coupled to and extending from a first surface of the first flat electrical conductor;
   a plurality of second flat electrical conductors, each second flat conductor coupled to a second end of the flexible base, and each of the plurality of second flat electrical conductors comprising a second connector electrically coupled to and extending from a first surface of the second flat electrical conductor;
   a plurality of blocking diodes, each blocking diode comprising a pair of wires that extend from a body of the blocking diode, wherein a first wire of the pair is electrically coupled to a particular first connector of a particular first flat electrical conductor of the plurality of first flat electrical conductors, and wherein a second wire of the pair is electrically coupled to a particular second connector of a particular second flat electrical conductor of the plurality of second flat electrical conductors;

the rollable solar power module array electrically coupled to the plurality of first flat electrical conductors; and a power system coupled, via the plurality of second flat electrical conductors, to receive electricity from the rollable solar power module array, wherein the plurality of blocking diodes is arranged to inhibit flow of electricity from the power system to the rollable solar power module array.

* * * * *